United States Patent [19]
Goto et al.

[11] Patent Number: 5,980,999
[45] Date of Patent: *Nov. 9, 1999

[54] METHOD OF MANUFACTURING THIN FILM AND METHOD FOR PERFORMING PRECISE WORKING BY RADICAL CONTROL AND APPARATUS FOR CARRYING OUT SUCH METHODS

[75] Inventors: Toshio Goto; Masaru Hori; Mineo Hiramatsu, all of Aichi-gun; Masahito Nawata, Nagoya, all of Japan

[73] Assignee: Nagoya University, Nagoya, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/623,256

[22] Filed: Mar. 28, 1996

[30] Foreign Application Priority Data

Aug. 24, 1995 [JP] Japan ..................................... 7-237880

[51] Int. Cl.⁶ .......................... H01L 21/20; H01L 21/302; H05H 1/24
[52] U.S. Cl. .......................... 427/572; 427/570; 427/571; 427/574; 427/575; 427/577; 427/578
[58] Field of Search ..................... 118/723 MP, 723 ME, 118/723 MR; 156/345; 216/67, 68, 69, 70; 427/570, 571, 572, 573, 574, 575, 577, 578; 438/711; 423/348, 349, 350

[56] References Cited

U.S. PATENT DOCUMENTS

| | | | |
|---|---|---|---|
| 4,504,518 | 3/1985 | Ovshinsky et al. | 427/38 |
| 4,828,649 | 5/1989 | Davis et al. | 438/711 |
| 4,878,994 | 11/1989 | Jucha et al. | 156/643 |
| 4,886,570 | 12/1989 | Davis et al. | 156/643 |
| 5,122,431 | 6/1992 | Kodama et al. | 423/346 |
| 5,560,779 | 10/1996 | Knowles et al. | 118/723 MP |

*Primary Examiner*—Jeffrey E. Russel
*Attorney, Agent, or Firm*—Baker & Botts, L.L.P.

[57] ABSTRACT

A first reactive gas is introduced into a vacuum chamber and a plasma of the thus introduced reactive gas is produced. A second reactive gas is introduced into a radical generating chamber and is dissociated to generate radicals whose density and composition are well controlled. Then, the thus generated radicals are injected into the plasma generated within the vacuum chamber such that an amount of a desired kind of radicals within the plasma is selectively increased or decreased. In this manner, a thin film having an excellent property can be deposited on a substrate placed in the vacuum chamber. Alternatively, a surface of a substrate placed in the vacuum chamber can be processed precisely and selectively.

8 Claims, 15 Drawing Sheets

FIG_1

200nm $H_2O/H_2 = 0.02$

200nm $H_2O/H_2 = 0.27$

200nm $H_2O/H_2 = 1.0$

200nm $H_2O/H_2 = 2.8$

FIG_7

FIG_9

FIG_14
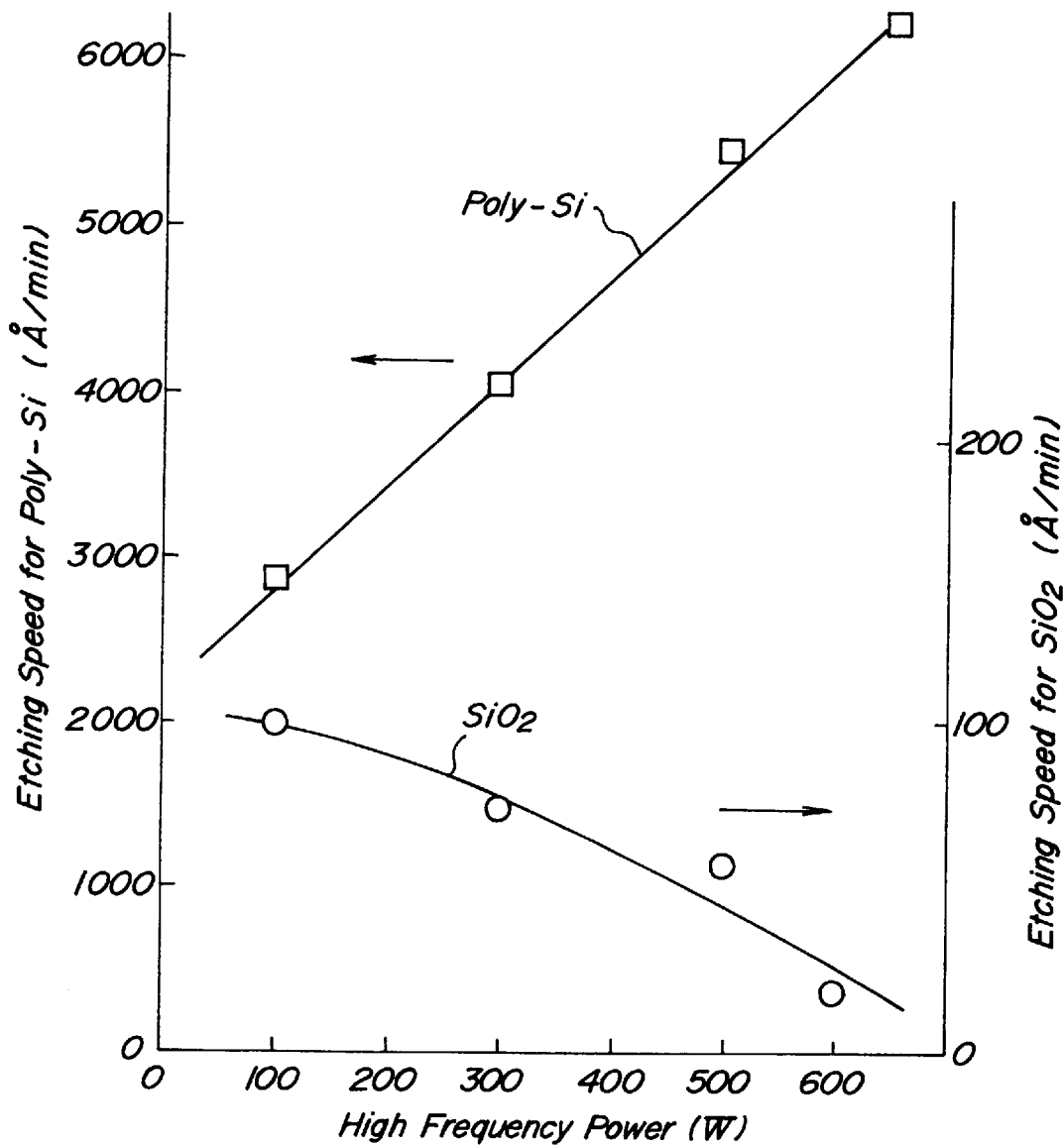

FIG_15
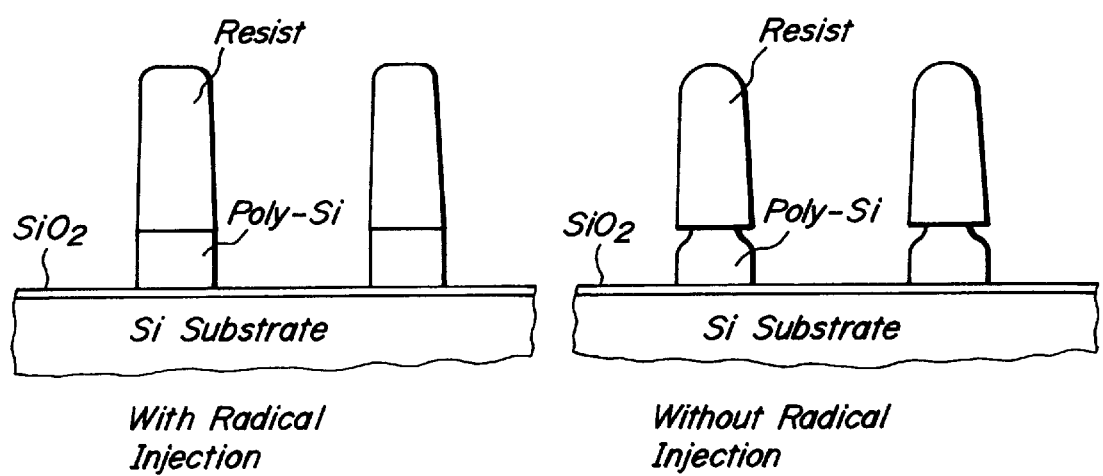

METHOD OF MANUFACTURING THIN FILM AND METHOD FOR PERFORMING PRECISE WORKING BY RADICAL CONTROL AND APPARATUS FOR CARRYING OUT SUCH METHODS

BACKGROUND OF THE INVENTION

The present invention relates to a method of manufacturing a functional material thin film by introducing controlled radicals into a plasma, and also relates to a method of performing a plasma process for a functional material by a controlled plasma. The present invention also relates to a surface processing apparatus for processing a surface of a substrate by a controlled plasma. In the present specification, the term "surface processing apparatus" means both an apparatus for manufacturing a thin film on a surface of a substrate by a plasma chemical vapor deposition and an apparatus for processing or changing a surface condition of a substrate by a plasma etching.

Techniques for fabricating a functional material thin film and for working a functional material precisely have been widely used in manufacturing thin film electronic devices such as LSI, and would be indispensable technique for developing new materials or new devices, and performing a precision working for realizing integrated circuits. In the method of manufacturing thin films and the method of performing a precision process, a given reaction gas is introduced into a plasma to produce ions and radicals by decomposition or excitation of the introduced gas, and then the thus generated ions and radicals are reacted with a substrate having a surface to be processed. In this manner, a thin film is deposited on the surface of the substrate or the surface of the substrate is processed. In these methods, the radicals perform important role for realizing these processes.

In the formation of thin films of functional materials, production of new materials, precision process, radicals play an important role, and densities of radicals and compositions of radicals are determined in accordance with external conditions such as pressures of gases, kinds of gases, applied electric powers, sizes of process vessels and materials of process vessels.

Since radicals are neutral electrically, and thus its control is extremely difficult.

Therefore, by adjusting such external parameters, it is impossible to increase a density of given radicals in a plasma, said radicals playing an important role in the thin film formation and precision process. Furthermore, it is impossible to control precisely a density and a composition of desired radicals. Therefore, it is difficult to realize a remarkable improvement in the formation of thin films and precision process.

In the formation of thin films made of functional materials and precision process, a plurality kinds of gases are used and a plural kinds of radicals are produced by decomposition of these gases. In this case, production cross sections of these radicals have energy dependency, so that it is impossible to realize desired density and composition of radicals from a plurality of gases within an energy range of a plasma to be used.

SUMMARY OF THE INVENTION

The present invention has for its object to provide a novel and useful method of manufacturing a thin film of a functional material and having an extremely high quality, which could not be obtained by known methods.

According to the invention, a method of manufacturing at thin film by a plasma control comprises the steps of:

introducing a substrate into a vacuum chamber;

forming a plasma of a reactive gas introduced into said vacuum chamber, said reactive gas containing a starting material whose thin film is to be formed on said substrate;

dissociating a reactive substance in an environment outside said vacuum chamber to produce radicals in such a manner that a density and a composition of said radicals are controlled; and introducing said radicals into the plasma within said vacuum chamber and a thin film is formed on said substrate.

In a preferable embodiment of the thin film manufacturing method according to the invention for forming a diamond thin film on the substrate, said reactive gas is formed by a first reactive gas containing carbon and said reactive substrate is formed by a second reactive gas consisting of a mixture gas containing at least hydrogen ($H_2$) and water ($H_2O$) at a ratio of the water to the hydrogen of 0.5.

In another preferable embodiment of the thin film manufacturing method according to the invention, said second reactive gas is formed by a gas selected from the group consisting of a gas containing fluorine, a gas containing chlorine, a hydrogen peroxide gas and an ozone gas.

In another embodiment of the thin film manufacturing method according to the invention, said first reactive gas is formed by a silane ($SiH_4$) or disilane ($Si_2H_6$), and said second reactive gas is formed by a gas selected from the group consisting of hydrogen ($H_2$), chlorine ($Cl_2$), fluorine ($F_2$), a gas containing chlorine and a gas containing fluorine. In this embodiment, on the substrate, there is formed an amorphous silicon thin film or a micro crystalline silicon thin film.

According to the invention, a method of performing a precision process a plasma control comprises the steps of:

introducing a substrate into a vacuum chamber;

forming a plasma of a reactive gas introduced into said vacuum chamber;

dissociating a reactive substance in an environment outside said vacuum chamber to produce radicals in such a manner that a density and a composition of said radicals are controlled; and introducing said radicals into the plasma within said vacuum chamber and said substrate is processed by said plasma.

In a preferable embodiment of the precision process method according to the invention, said reactive gas is formed by a gas selected from the group consisting of a fluorocarbon gas, a halogen gas containing chlorine, a halogen gas containing fluorine and a gas containing hydrogen atom, and said reactive substance is formed by a second reactive gas such that said radicals contain at least one kind of radical selected from the group consisting of hydrogen, carbon, chlorine, fluorine, bromine, silicon, oxygen and nitrogen.

In a preferable embodiment of the precision process method according to the invention, within said vacuum chamber, the plasma is generated by subjecting said reactive gas to an excitation by microwave, UHF wave, VHF wave, RF wave, DC electric field or electron beam.

It should be noted that the microwave has a frequency not lower than about 1 GHz, the UHF wave has a frequency of 300–3000 MHz, the VHF wave has a frequency of 30–300 MHz, and the RF wave has a frequency 30–30 MHz.

In the precision processing method according to the invention, the reactive substance is decomposed by plasma, irradiation of light, heat, irradiation of electron beam, catalysis or particle bombardment.

In the method according to the invention, said reactive substance is dissociated by a plasma which is formed by subjecting the reactive substance to microwave, UHF wave, VHF wave, RF wave, DC electric field or electron beam.

An apparatus for processing a substrate with a plasma comprises:

a vacuum chamber including a plasma discharge mechanism for generating a plasma;

an exhausting means connected to said vacuum chamber for exhausting said vacuum chamber to a high vacuum;

a radical generating chamber connected to said vacuum chamber and including a radical producing mechanism for dissociating a reactive substance into radicals in such a manner that a density and/or a composition of the radicals can be controlled;

whereby the radicals whose density and/or composition is controlled are introduced into said vacuum chamber and are injected into said plasma within said vacuum chamber.

According to the invention, said radical generating mechanism may be formed by plasma generating mechanism, light irradiating mechanism, heating mechanism, electron beam irradiating mechanism, catalysis mechanism or particle bombarding mechanism.

In a preferable embodiment of the precision processing apparatus according to the invention, said plasma generating mechanism includes an electric source for applying or generating microwave, UHF wave, VHF wave, RF wave, DC electric field or electron beam.

In an embodiment of the apparatus according to the invention, said radical generating mechanism comprises a plasma generating mechanism which is constructed to produce a plasma under a function of microwave, UHF wave, VHF wave, RF wave, DC electric field or electron beam.

BRIEF DESCRIPTION OF THE DRAWINGS

FIG. 14 is a graph representing a dependency of etching speeds of poly-crystalline silicon and silicon oxide film upon an applied high frequency electrical power when a microwave power is applied; and FIG. 15 shows schematic side views depicting different conditions of etching.

DESCRIPTION OF THE PREFERRED EMBODIMENTS

Figure 1:
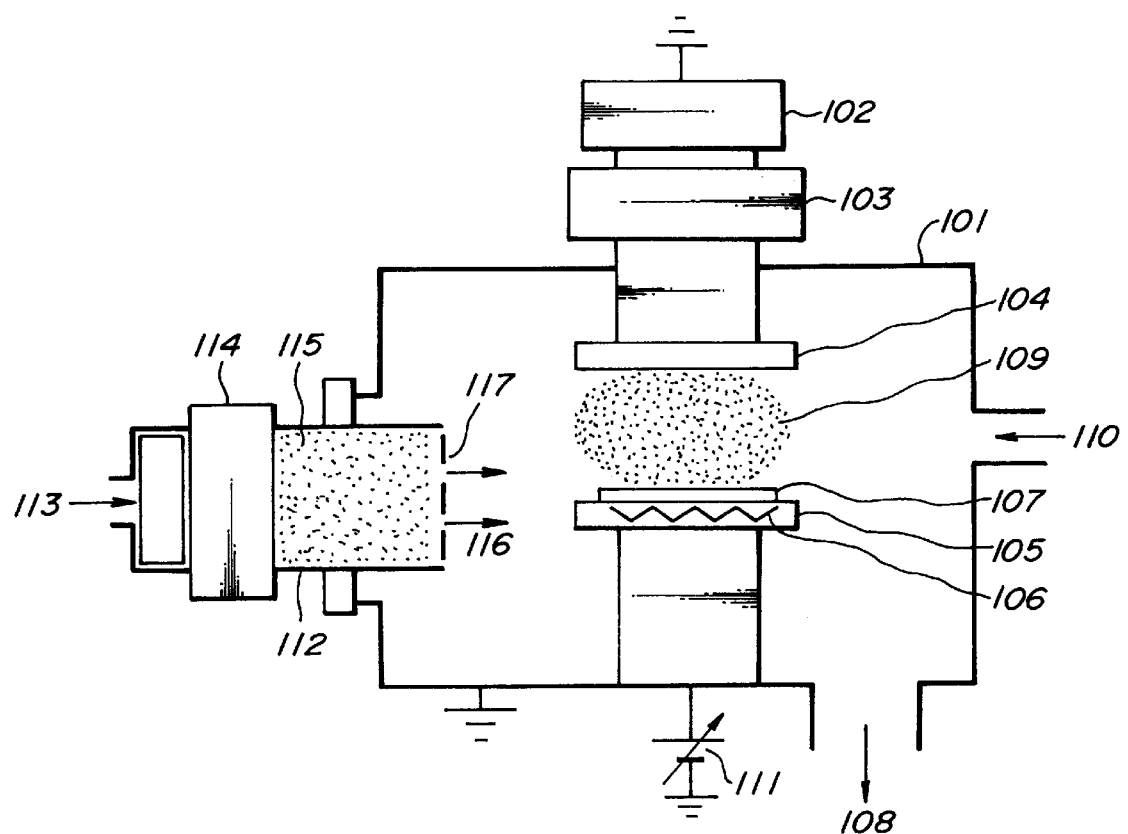
FIG. 1 is a schematic view showing an embodiment of the apparatus for forming a thin film by the thin film manufacturing method according to the invention.

FIG. 1 is a schematic view showing a first embodiment of the thin film forming apparatus according to the invention. In the present invention, the apparatus is constructed as the plasma CVD apparatus for depositing a diamond thin film.

In FIG. 1, 101 denotes a vacuum chamber, 102 a high frequency power source, 103 a matching mechanism, 104 an upper electrode, 105 a lower electrode, 106 a heater, 107 a substrate on which a diamond thin film is to be formed, 108 an exhausting port connected to a vacuum exhausting device not shown, 109 a plasma, 110 a gas inlet and 111 represents a bias voltage source. According to the invention, radicals are supplied to the vacuum chamber 101. To this end, there is further provided a radical generating mechanism, in which 112 denotes a radical generating tube, 113 a gas inlet, 114 a radical generator, 115 a plasma, 116 radicals and 117 represents radical slits.

The inventors of the instant application have conducted various experiments for depositing diamond thin films on the substrate 107 by using the apparatus shown in FIG. 1 and have found the following facts:

A mixture gas of $CH_4$, $H_2$ and $H_2O$ was introduced into the vacuum chamber 101 including parallel plate electrodes 104 and 105 via the gas inlet 110, a high frequency power (RF wave) is applied to the parallel plate electrodes 104 and 105 to generate a plasma 109 within the vacuum chamber 101. A mixing ratio of the mixture gas was changed and at the same time, a pressure of the mixture gas and a value of the high frequency power were changed in various manners. Silicon substrates 107 were heated by the heater 106 to a temperature of 600° C., and several tens DC voltage was applied to the substrates from the DC bias voltage source 111. Then, thin films deposited on the substrates 107 were examined, and it has been found that thin films containing hydrogen carbide were deposited on the substrates, but a diamond thin film was not formed.

Then, $CH_4$ was introduced into the vacuum chamber 101 via the gas inlet 110 and $H_2$ gas was introduced into the radical generating tube 112 via the gas inlet 113. The hydrogen gas was decomposed to generate H-radicals and the thus generated H-radicals were supplied into the plasma 109 produced between the parallel plate electrodes 104 and 105. Then, a growth of seeds of diamond was recognized having a grain size of about 2000 Å. Depending upon the pressure, high frequency power and a ratio of $CH_4$ and $H_2$, a size of deposited diamond grain was changed, but it was impossible to form a perfect diamond thin film.

Then $H_2O$ was gradually added to $H_2$. Then, an amount of non-diamond component within deposited thin films was gradually decreased, and when $H_2O$ was added to $H_2$ by a ratio ($H_2O/H_2$) of not less than 0.5, a non-diamond component was largely reduced and diamond thin films were deposited on the substrate.

From the above experiments, it has been found that under the plasma having an electron density not higher than $10^{10}/cm^3$ which is generally obtained by applying the high frequency power (RF) to the parallel plate electrodes in the known apparatus, a diamond thin film could not be formed, but when radicals effective for a formation of a diamond film are selectively introduced, it is first possible to deposit a diamond film.

In order to investigate a mechanism for forming a diamond film, radicals in gaseous phase were examined by an emission spectroscopy and laser spectroscopy. Then, H-radical, OH-radical and $CH_3$ radical were recognized. Further, etching property for a diamond film and a non-diamond film was examined by preparing a diamond film and a non-diamond film, the $CH_4$ gas was not introduced from the gas inlet 110, a ratio of $H_2$ and $H_2O$ was changed and a plasma was generated by applying the high frequency power to the parallel plate electrodes under the same condition. Then, it has been confirmed that when a ratio of $H_2O$ to $H_2$ was set to not less than 0.5, a selection ratio of the non-diamond to the diamond is improved. That is to say, it has been found that H-radicals or OH radicals promote a growth of diamond and remove effectively a non-diamond component, so that a diamond film is formed.

Based on the above mentioned recognition, a plasma was generated between the parallel plate electrodes by introducing $CH_4$ or $CH_3OH$ gas, and at the same time radicals of F, CF, $CF_2$, $CF_3$, Cl, OH and O were introduced into the plasma. Then, diamond films were deposited on substrates. The above mentioned radicals were produced by introducing, via the gas inlet 113, a mixture gas of $H_2$ having added thereto a fluorocarbon gas such as $C_2F_6$ and $CF_4$, $O_2$, CO, $H_2O_2$, alcohol, $F_2$, HF, $Cl_2$, HCl and $NF_3$ at a suitable mixing ratio, and by decomposing the mixture gas by means of plasma, heat, radiation, electron, catalysis or particle bombardment.

As explained above, according to the invention, it is possible to deposit a diamond film having a high quality on the substrate 107 by a function of $CH_3$-radicals generated in the plasma and H-radicals or OH-radicals introduced into the plasma. In this manner, according to the invention, the radicals within the plasma can be precisely and easily performed by introducing the radicals generated in a space which is separated from the plasma space into the plasma.

Now a concrete example of forming a diamond thin film will be explained in detail.

At first a silicon substrate 107 having a surface orientation of (100) is introduced in the vacuum chamber 101 and is placed on the lower electrode (sample plate) 105. Then, the heater 106 provided under the lower electrode 105 is energized to heat the substrate 107 and lower electrode 105 to 600° C. After exhausting the vacuum chamber 101, a methyl alcohol ($CH_3OH$) gas is introduced via the gas inlet 110 into the vacuum chamber at a flow rate of 12 SCCM. Then, a pressure inside the vacuum chamber 101 is kept to a constant value of 0.7 Pa. In this case, a bias voltage of +5V is applied to the lower electrode 105 and substrate 107 from the bias voltage source 111. Then, a mixture gas of $H_2$ and $H_2O$ is introduced into the radical generating tube 112 made of quartz via the gas inlet 113, while a mixing ratio of $H_2$ and $H_2O$ is changed. The mixture gas is supplied at a flow rate of 240 SCCM. A total pressure of the mixture gas is maintained to a constant value of 13 Pa, so that a pressure in the vacuum chamber 101 is remained to a constant value of 13.7 Pa.

Then, a microwave having a frequency of 2.45 GHz and a power of 100 W is applied to the radical generating device 114 to produce a plasma and the mixture gas of $H_2$ and $H_2O$ is decomposed by the thus generated plasma. Since the slits 117 are provided at a distal end of the radical generating tube 112, the methyl alcohol gas ($CH_3OH$) introduced into the vacuum chamber 101 by means of the gas inlet 110 is hardly diffused into the plasma region excited by the high frequency microwave.

As soon as the plasma is generated by the microwave, a RF wave having a frequency of 13.56 MHz and a power of 150 W (power density 2.6 $W/cm^2$) is applied across the upper electrode 104 and the lower electrode 105 and a methyl alcohol plasma is generated. Then, H-radicals or OH-radicals generated by exciting the $H_2$ and $H_2O$ gas with the microwave are introduced into the methyl alcohol plasma. Then, a diamond thin film is deposited on the silicon substrate 107.

Figure 2:
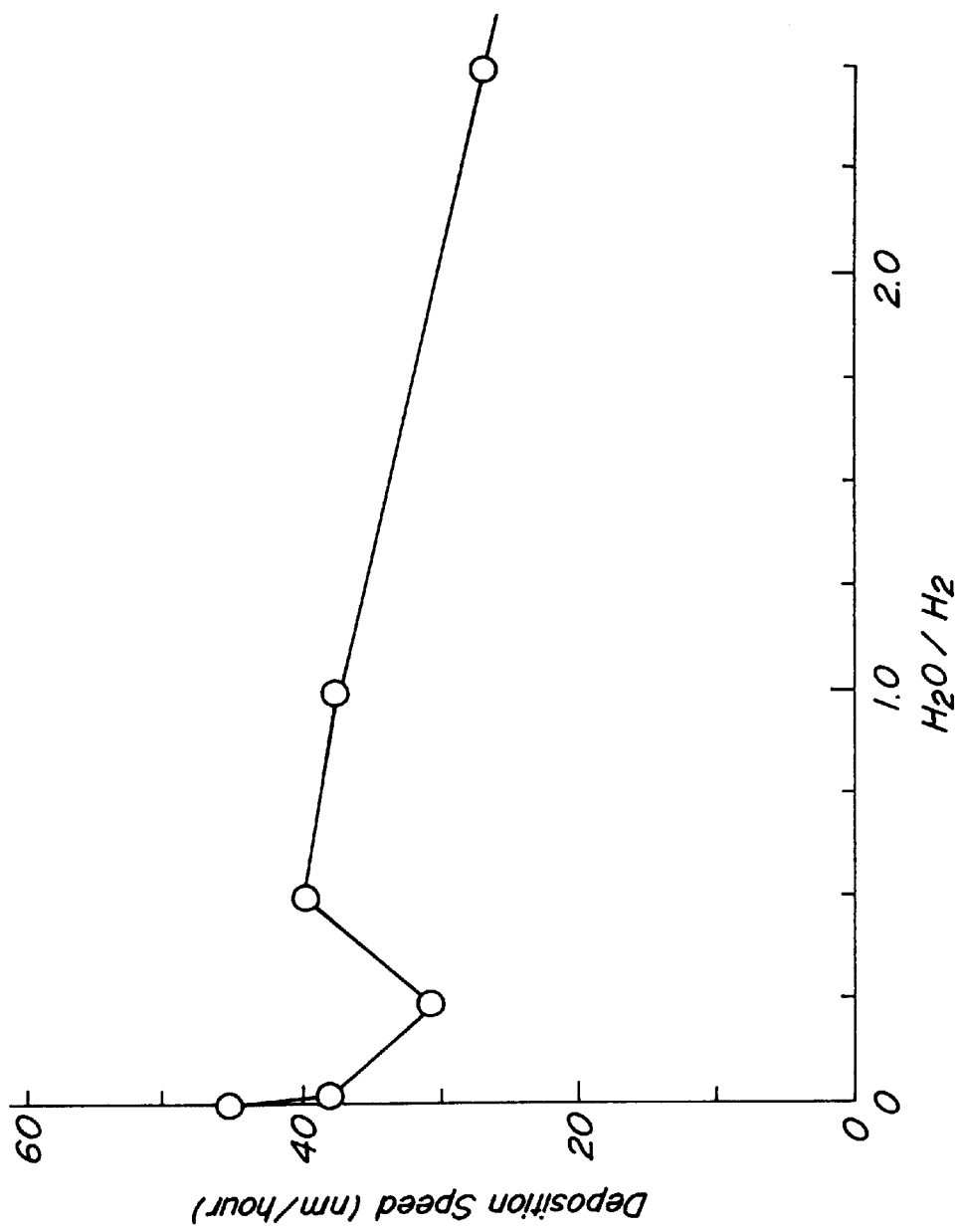
FIG. 2 is a graph representing a dependency of a deposition speed upon a partial pressure of water ($H_2O$)
Figure 3A:
FIGS. 3A–3D are SEM photographs showing a dependency of a film quality or surface condition upon a partial pressure of water ($H_2O$)
Figure 3B:
Figure 3C:
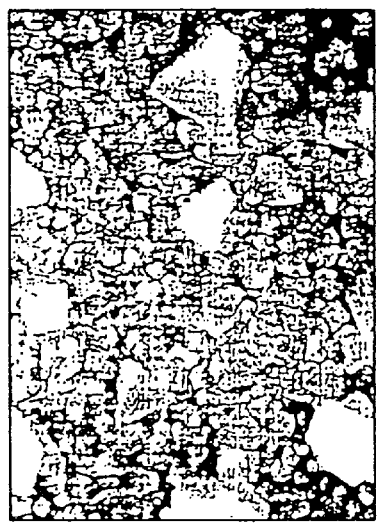
Figure 3D:

Diamond films obtained by carrying out the above explained deposition process for three hours by changing a mixing ratio of $H_2$ and $H_2O$ were estimated by SEM and Raman spectroscopy. FIG. 2 is a graph showing a dependency of a deposition speed upon a partial pressure of $H_2O$, FIGS. 3A–3D are photographs of SEM representing surface conditions of the deposited diamond films, and a dependency of film quality upon a ratio of $H_2O/H_2$. The film quality is estimated by a ratio of an amount of a diamond component and an amount of a non-diamond component.

From FIG. 2, it is generally understood that a deposition speed is gradually decreased in accordance with an increased of a partial pressure of $H_2O$, i.e. an increase in a ratio $H_2O/H_2$ of the mixture gas. Within a range from the ratio of $H_2O/H_2$ of 0.25 to 0.5, the deposition speed is increased. In a range smaller than 0.25, there are formed diamond seeds, but a non-diamond component is also detected. From the photographs shown in FIGS. 3A to 3D, it has been found that when a ratio of $H_2O/H_2$ of the mixture gas is larger than 0.5, an amount of a diamond component is abruptly increased and diamond is grown over the whole substrate surface.

Figure 4:
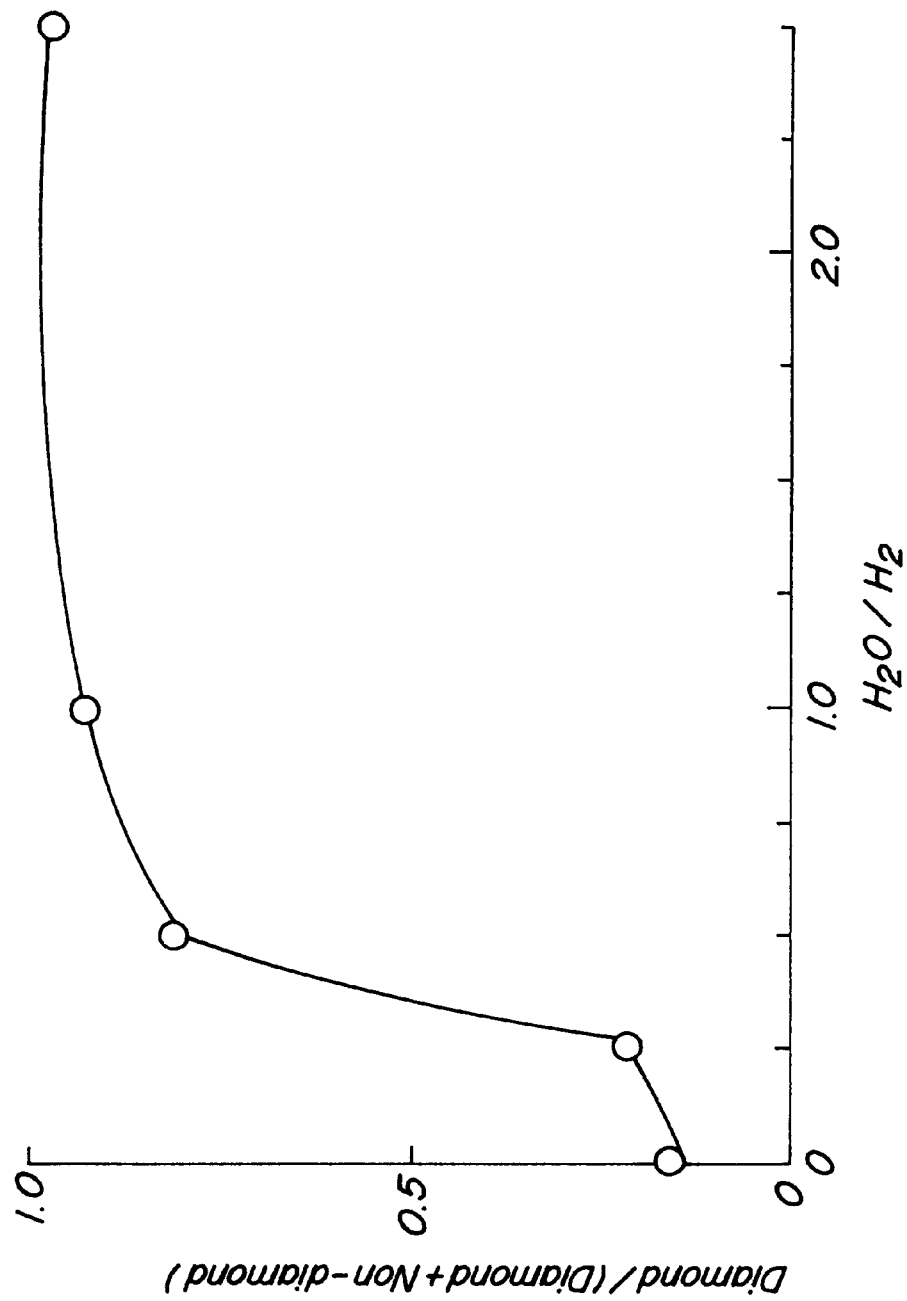
FIG. 4 is a graph expressing a dependency of a diamond composition of a thin film a containing ratio of water ($H_2O$)

From the graph in FIG. 4, it is recognized that when a ratio of $H_2O/H_2$ is small, but only a spectrum at 1333 $cm^{-1}$ due to a diamond component, but also a spectrum due to a non-diamond component appears near 1500 $cm^{-1}$. From the graph of FIG. 4, it can be recognized that when a ratio of $H_2O/H_2$ is increased, an intensity of the spectrum due to a non-diamond component is decreased, and when said ratio is larger than 0.5, an amount of a non-diamond component is abruptly reduced and a diamond is formed over a whole film.

Then, in order to investigate a mechanism of formation of a diamond film, previously formed diamond films and non-diamond films were subjected to plasmas under the same condition as that for forming the diamond film, but the supply of the methyl alcohol gas was stopped, while a ratio of $H_2O/H_2$ was changed. Then, it has been found that both the diamond film and non-diamond film were etched.

Figure 5:
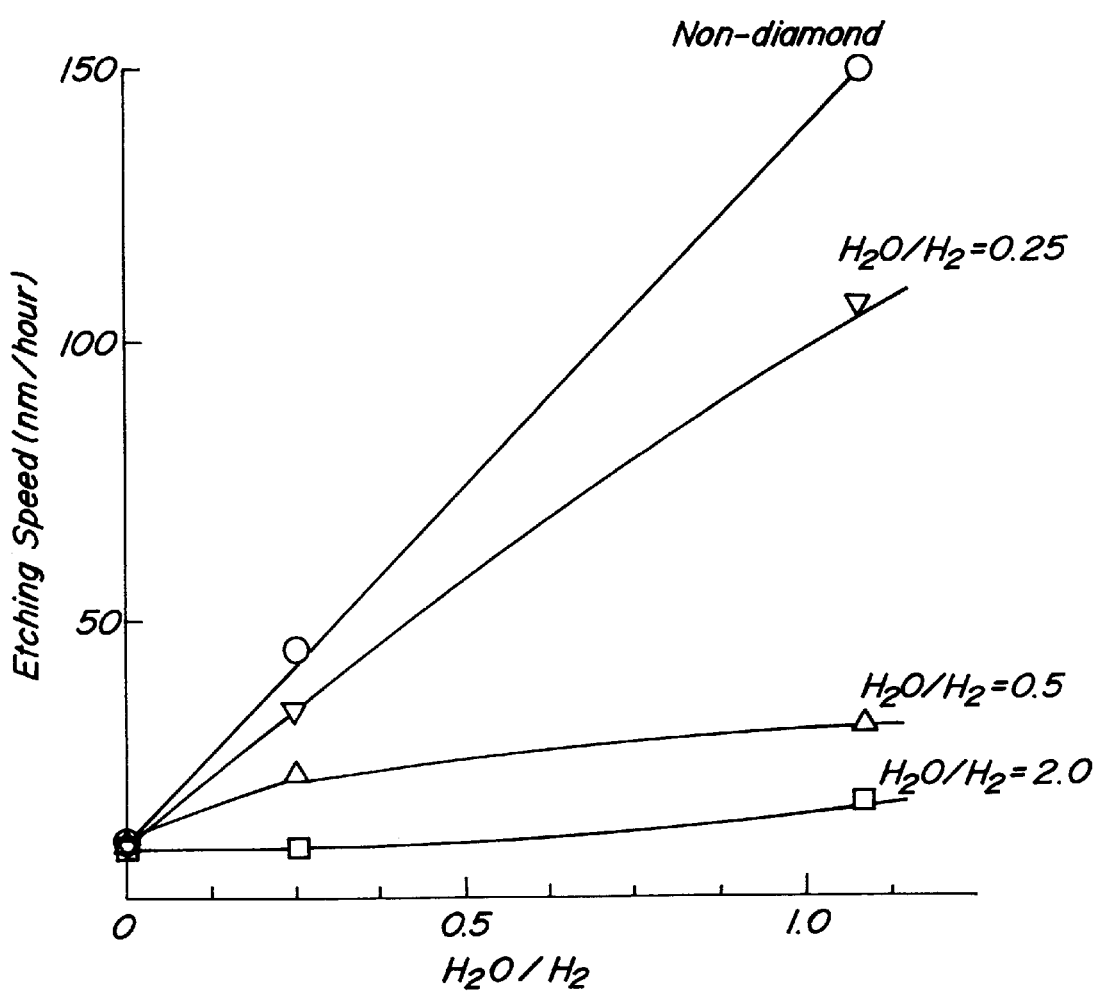
FIG. 5 is a graph denoting a dependency of etching rates fir diamond film and non-diamond film up a partial pressure of water ($H_2O$)

FIG. 5 is a graph showing a dependency of etching speeds for the diamond film and non-diamond film upon a partial pressure of $H_2O$. In FIG. 5, values of $H_2O/H_2$ described near curves denote a ratio of $H_2O/H_2$ for forming the diamond films.

From the graph of FIG. 5, it is recognized that an etching speed for the non-diamond film is increased in accordance with an increase of a ratio $H_2O/H_2$, but an etching speed for the diamond films formed under a radio of $H_2O/H_2$ not less than 0.5 is not scarcely increased even though a ratio of $H_2O/H_2$ is increased. From this fact, it is recognized that radicals for removing effectively a non-diamond component are introduced into the plasma.

Figure 6:
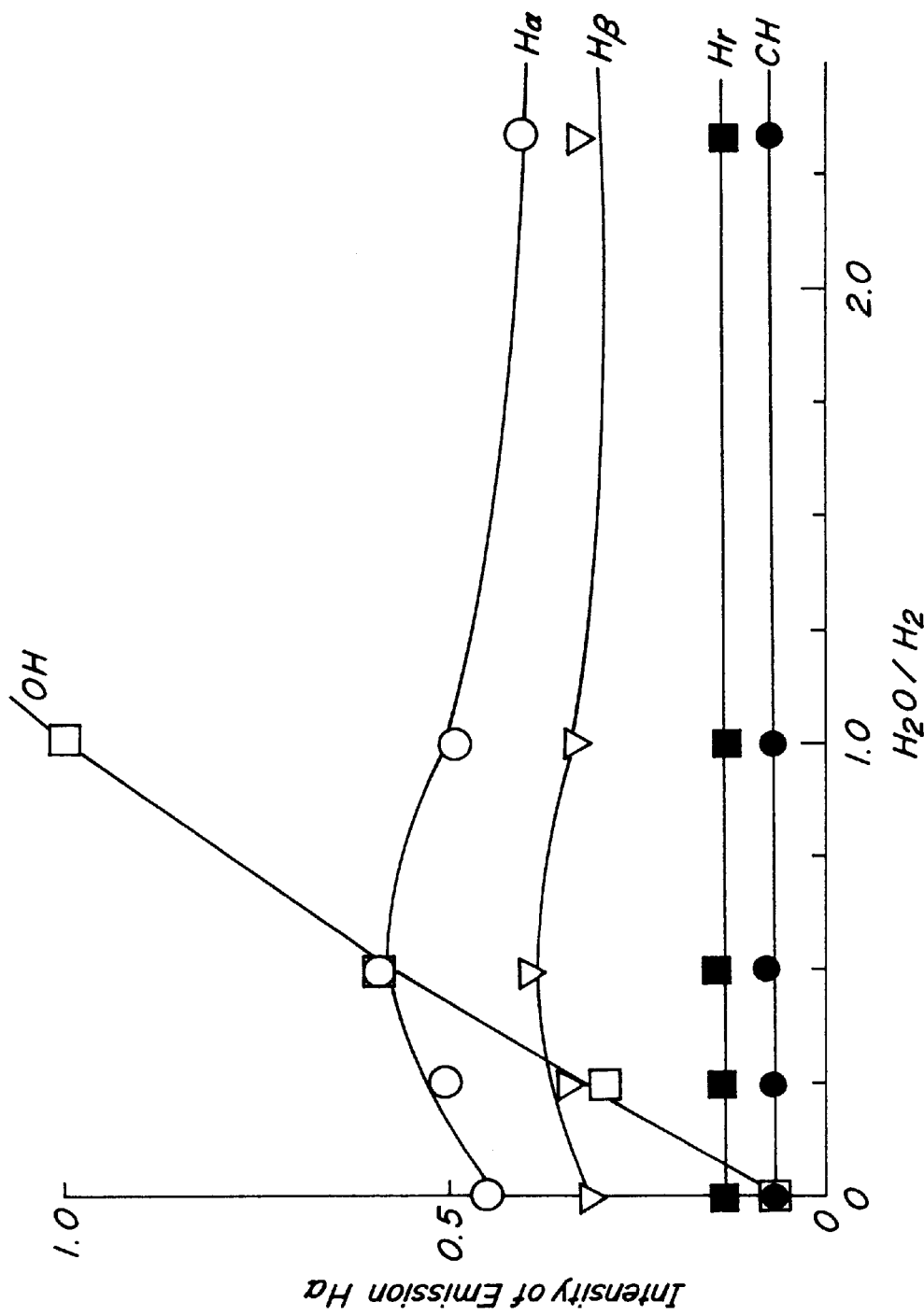
FIG. 6 is a graph presenting a fluorescent intensity of radicals upon a partial pressure of water ($H_2O$) during a formation of a thin film.

By using the emission spectroscopy, a dependency of an intensity of emission of radicals during the formation of thin films upon a partial pressure of $H_2O$ was examined. FIG. 6 represents a result of the examination. An intensity of emission Hα is increased in accordance with an increase in the partial pressure is $H_2O$, arrives at a peak at a ratio $H_2O/H_2$ of 0.5, and then is gradually decreased. It is further recognized that an amount of OH-radicals is increased abruptly in accordance with an increase in a partial pressure of $H_2O$.

From the above experiments and analyses, it has been found that by dissociating a mixture gas of $H_2O$ and $H_2$ by the microwave to generate H-radicals or OH-radicals and by injecting the thus generated radicals to the plasma, it is possible to form a diamond thin film having a high quality.

It has been further confirmed experimentally that diamond films of high quality could be also obtained by introducing a methane gas ($CH_4$) from the gas inlet 110 instead of the methyl alcohol gas ($CH_3OH$) under such a condition that a ratio of $H_2O$ to $H_2$ was set to be not less than 0.5, while other conditions such as pressure, high frequency power and bias voltage were changed in various manners.

The inventor shave conducted experiments by changing the hydrogen gas in the above mentioned mixture gas of $H_2O$ and $H_2$ to a fluorine containing gas such as a $C_2F_6$ gas, $CF_4$, $F_2$, HF and $NF_3$, a chlorine containing gas such as $Cl_2$ and HCl, $H_2O_2$ and $O_3$ and by injecting radicals of H, CF, $CF_2$, $CF_3$, O, F and Cl into plasmas. From these experiments, it has been confirmed that diamond thin films having excellent quality can be manufactured by suitably selecting various process parameters.

Figure 7:
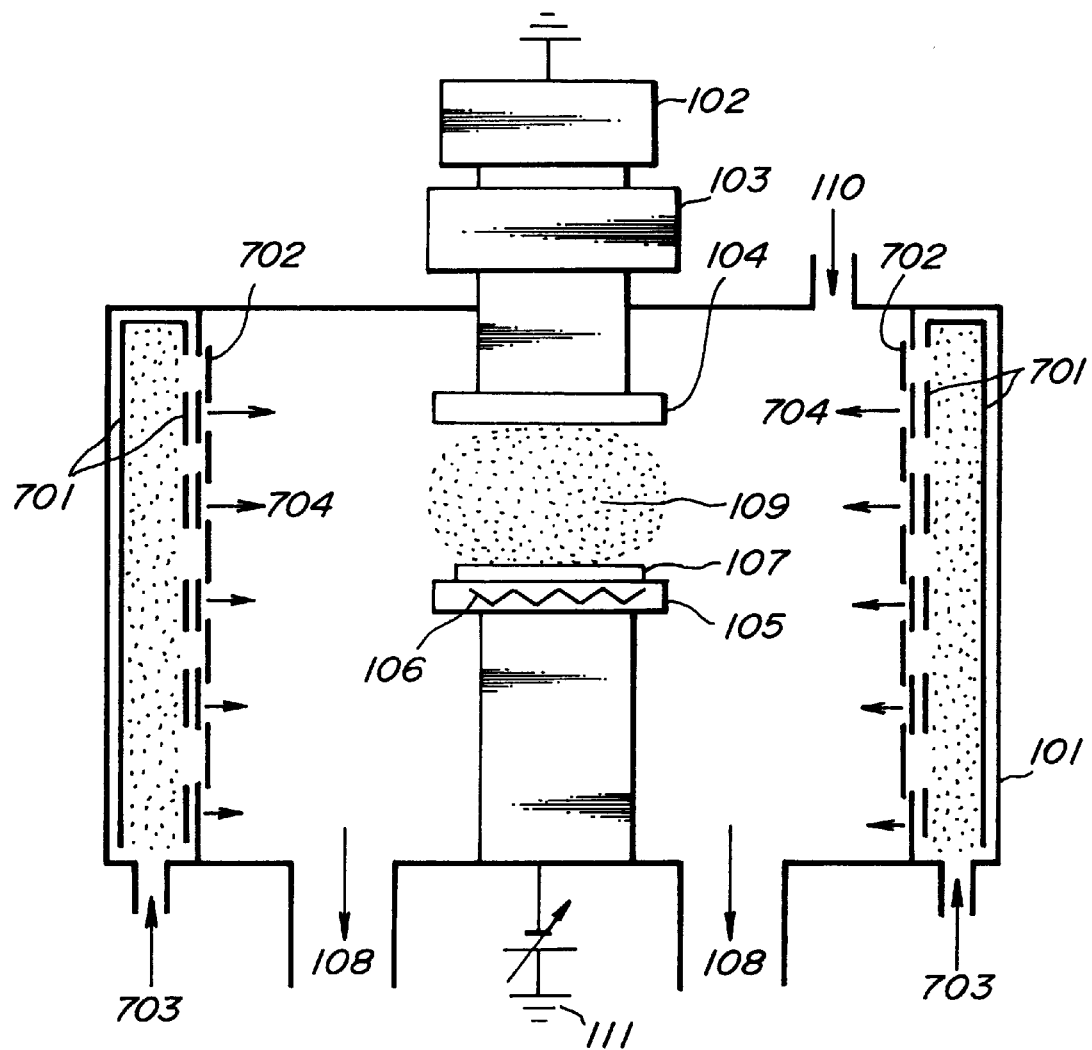
FIG. 7 is a schematic view illustrating an embodiment of the apparatus for forming a thin film according to the thin film manufacturing method according to the invention.

FIG. 7 is a schematic view illustrating a second embodiment of the plasma surface processing apparatus according to the invention. The apparatus of the present embodiment is constructed as a plasma CVD apparatus for forming non-crystalline or micro crystalline silicon thin films.

In FIG. 7, portions similar to those shown in FIG. 1 are denoted by the same reference numerals used in FIG. 1 and these portions are not explained here. In FIG. 7, a reference numeral 701 denotes a radical generating mechanism (wall member), 702 slits, 703 second reactive gas inlets, and a reference numeral 704 indicates radicals.

In order to deposit a non-crystalline or micro crystalline silicon film on a substrate (silicon substrate) 107, a silane ($SiH_4$) gas is introduced into the vacuum chamber 101 via the first gas inlet 110 and a silane plasma is produced between the upper and lower electrodes 104 and 105 and at the same time H-radicals are generated by dissociating a hydrogen gas supplied form the second gas inlets 703 under a function of a catalysis of the wall material Pd of the radical generating mechanism 701 and are injected the thus generated H-radicals into the silane plasma through the radical slits 702. Then, non-crystalline silicon films having good quality were formed. By changing an amount of H-radicals, micro crystalline silicon thin films having high quality could be successfully formed at a low temperature. It should be noted that according to the invention, Cl-radicals, or F-radicals may be generated by thermal dissociation or light dissociation of $Cl_2$ or $SiH_2Cl_2$ or microwave excitation plasma dissociation of $F_2$ and these radicals may be injected into plasmas to form non-crystalline or micro crystalline silicon films having high quality.

Also in the present embodiment, it is possible to deposit non-crystalline and micro crystalline silicon thin films having good quality on silicon substrates 107 by $SiH_3$-radicals generated within the plasmas and H-radicals or F-radicals injected into the plasmas.

Now several experiments carried out by using the apparatus of the second embodiment shown in FIG. 7 for forming amorphous or non-crystalline silicon thin films and micro crystalline silicon thin films will be explained.

At first, a silicon substrate 107 having a surface orientation (100) was introduced into the vacuum chamber 101 and was placed on the lower electrode 105. Then, the substrate 107 was heated by the heater 106 to a temperature of 250° C. and was kept at this temperature during the process. Next, a silane gas ($SiH_4$) was introduced into the vacuum chamber 101 via the first gas inlet 110 at a flow rate of 30 SCCM and a pressure inside the vacuum chamber was kept to 3 Pa. A hydrogen gas ($H_2$) was introduced into the spaces surrounded by the radical generating material (Pd) walls 701 via the second gas inlets 703. It should be noted that the Pd walls 702 are provided to surround the plasma space. Moreover, the Pd walls 702 were heated by a heat not shown to a temperature not lower than 400° C.

As explained later, the hydrogen gas introduced via the second gas inlets 703 was substantially fully dissociated under the catalysis of the Pd walls 702 to generate H-radicals.

A RF wave having a frequency of 13.56 MHz and a power of 50 W (power density 0.5 W/cm$^2$) was applied across the upper and lower electrodes 104 and 105 by means of the high frequency power source 102 to form a silane plasma between the electrodes. In the manner explained above, the hydrogen gas ($H_2$) introduced via the second gas inlets 703 was dissociated into H-radicals by the action of the catalysis of the heated Pd walls 702 and the thus generated H-radicals were injected into the silane plasma produced between the upper and lower electrodes 104 and 105.

A condition of the generation of the H-radicals was examined by an infra-red semiconductor laser absorption spectroscopy. Within the silane plasma, $SiH_3$-radicals having long life time were locally existent near the parallel plane plate electrodes 104 and 105. Further, a part of $SiH_3$-radicals were spread up to a boundary of the space within the vacuum chamber 101, but since there are formed slits 704 between the plasma space and the radical generating space surrounded by the Pd walls 702, the $SiH_3$-radicals could not be spread into the radical generating space. Therefore, no deposition was recognized on the Pd walls 702, so that its catalysis was not deteriorated at all. On the surface of the silicon substrate 107 placed on the lower electrode 105, there was deposited an amorphous silicon (a-Si) thin film by a reaction of the $SiH_3$-radicals and the injected H-radicals.

Next experiments were conducted without injecting the H-radicals into the plasma. That is to say, a silane gas ($SiH_4$) was introduced via the first gas inlet 110 and a hydrogen gas ($H_2$) was introduced via the second gas inlets 703, while the Pd walls 702 were not heated. A partial pressure of the hydrogen gas ($H_2$) was maintained at a constant pressure of 3 Pa. The experiments were carried out by changing various conditions such as high frequency power. Then, a density of defects in obtained silicon films was examined by an electron spin resonance (ESR) method. A defect density was about $10^{16}$/cm$^3$.

When the Pd walls 702 were heated to a temperature not lower than 400° C. to generate H-radicals and the thus generated radicals were injected into the silane plasma, it was possible to obtain amorphous silicon thin films having a defect density of about $10^{15}/cm^3$. From these experiments, it has been confirmed that a quality of silicon thin films formed by the plasma CVD can be improved by injecting H-radicals under controlled conditions.

In the above experiments, a density of H-radicals within the plasma was also measured by a two-photon excitation laser-induced fluorescence method. From this measurement, it was recognized that a density of H-radicals is increased from about $2 \times 10^{18}/cm^3$ to $1 \times 10^{19}/cm^3$ by injecting the H-radicals into the plasma. From the above experiments, one could understand that an injection of H-radicals into the plasma is very effective for forming an amorphous silicon (a-Si) thin film having a high quality.

Next, another experiments for forming micro crystalline silicon thin films were conducted also by using the apparatus shown in FIG. 7. Like as the above mentioned experiments, a silicon substrate 107 having a surface orientation (100) was placed on the lower electrode 105 within the vacuum chamber 101, and the substrate was heated by the heater 106 to a temperature of 330° C.

A silane gas ($SiH_4$) was introduced into the vacuum chamber 101 via the first gas inlet 110 at a flow rate of 3 SCCM and a pressure inside the vacuum chamber was kept to 0.33 Pa.

Next, a hydrogen gas ($H_2$) was introduced into the radical generating space formed by the Pd walls 701 via the second gas inlets 703 at a flow rate of 27 SCCM. A RF wave having a frequency of 13.56 MHz and a power of 50 W (power density 0.5 W/cm$^2$) was applied across the upper and lower electrodes 104 and 105 by means of the high frequency power source 102 via the impedance matching device 103 to form a silane plasma between the electrodes.

Figure 8:
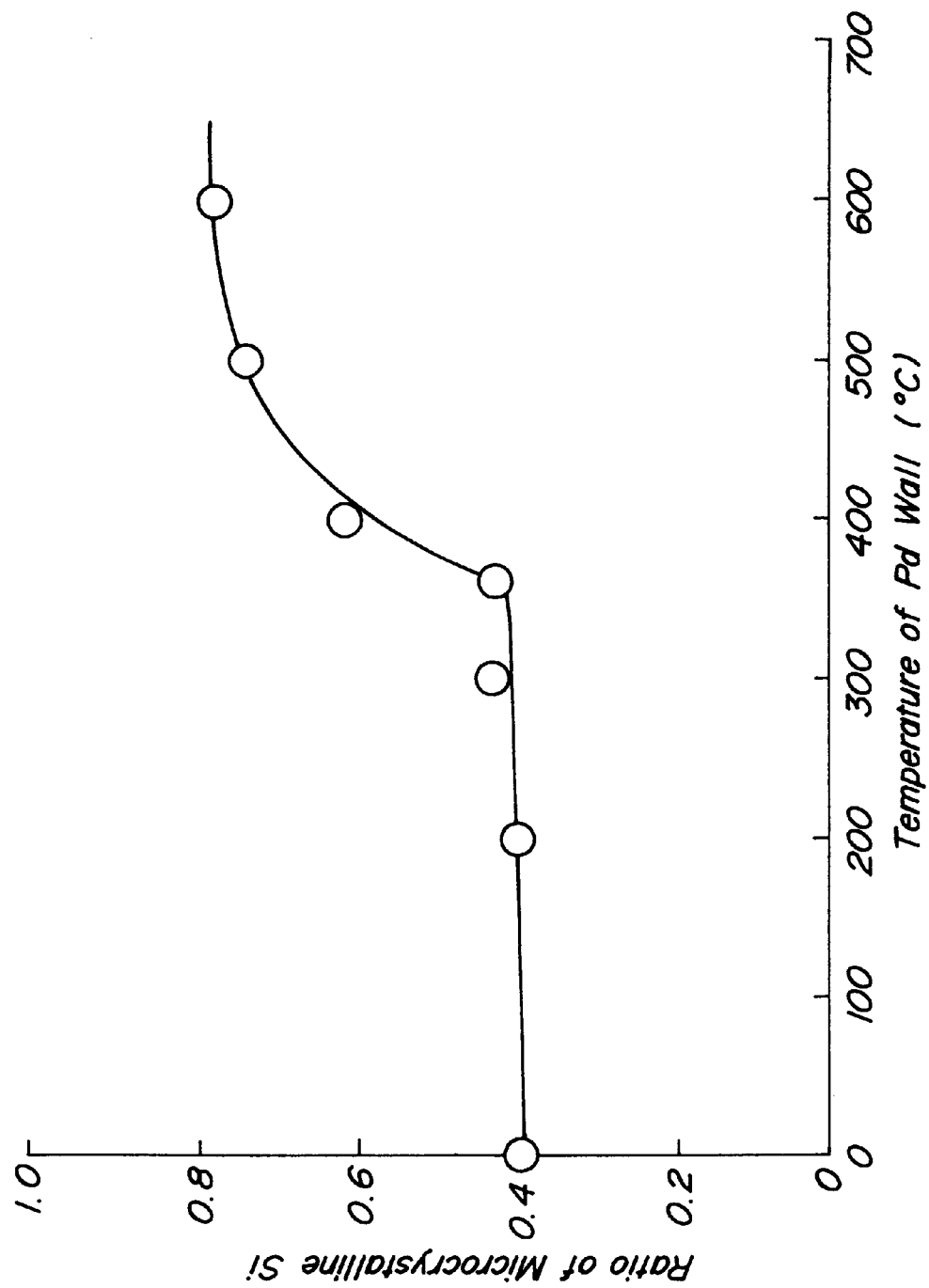
FIG. 8 is a dependency of a depositing ratio of micro crystalline silicon on a silicon thin film upon a temperature of Ni wall.

FIG. 8 is a graph showing a ratio of micro crystalline silicon in deposited thin films, while a temperature of the Pd walls are changed. A content of micro crystalline silicon was measured by a spectrum ellipsometric method. When H-radicals are not injected into the plasma, i.e. when the Pd walls are at a room temperature, a deposited silicon film is made of amorphous silicon and micro crystalline silicon. An amount of micro crystalline in the silicon film was about 40% by volume.

When H-radicals were injected into the plasma by heating the Pd walls 702 to a temperature not lower than 400° C., an amount of micro crystalline silicon was increased abruptly. From these experiments, it has been found that high quality amorphous and micro crystalline silicon films having a low defect density can be obtained by injecting radicals into plasmas.

Now experiments for forming diamond thin films by using the apparatus shown in FIG. 1 will be explained.

A silicon substrate 107 having a surface orientation (100) was introduced into the vacuum chamber 101 and was placed on the lower electrode 105. Then, the substrate 107 was heated by the heater 106 to a temperature of 250° C. and was kept at this temperature during the process. Next, a silane gas ($SiH_4$) was introduced into the vacuum chamber 101 via the first gas inlet 110 at a flow rate of 30 SCCM and a pressure inside the vacuum chamber was kept to 3 Pa.

A RF wave having a frequency of 13.56 MHz and a power of 50 W (power density 0.5 W/cm$^2$) was applied across the upper and lower electrodes 104 and 105 by means of the high frequency power source 102 to form a silane plasma between the electrodes.

A chlorine gas ($Cl_2$) was introduced into the radical generating tube 112 via the second gas inlet 113 at a flow rate of 5 SCCM and a pressure inside the radical generating tube was kept to 4 Pa. The radical generating device 114 was formed by a radiation irradiating device including a Hg—Xe lamp and the chlorine gas was irradiated with radiation having a power of 200 W and a wavelength of 200–450 nm. The chlorine gas ($Cl_2$) was dissociated by the irradiation and Cl-radicals 116 were generated.

The Cl-radicals generated in the manner mentioned above by the dissociation of the chlorine gas ($Cl_2$) due to the irradiation were then injected into a plasma 109 of the silane gas ($SiH_4$) produced between the parallel plate electrodes 104 and 105 within the vacuum chamber 101. Since the slits 117 were provided at the distal end of the radical generating tube 112, the silane gas ($SiH_4$) introduced via the first gas inlet 110 was hardly diffused into the radical generating tube.

When Cl-radicals were not generated, a mixture gas of the silane gas ($SiH_4$) introduced from the first gas inlet 110 and the chlorine gas ($Cl_2$) introduced via the second gas inlet 113 was supplied between the parallel plate electrodes 104 and 105 to produce a high frequency excited plasma of the mixture gas. During the formation of thin films, various conditions were changed and a density of defects and a stability due to light irradiation of deposited thin films were examined by the electron spin resonance (ESR) method. A density of defects was in an order of $10^{15}/cm^3$. In order to estimate a light decay property, immediately after irradiating the films with pulse laser, a density of defects was measured. A density of defects was in an order of $10^{17}/cm^3$.

When Cl-radicals were injected into the plasma by energizing the Hg—Xe lump, a density of defects of deposited films was in an order of $10^{15}/cm^3$, and a density of defects after the pulse laser irradiation was in an order of $10^{16}/cm^3$. From these experiments, it has been found that high quality amorphous silicon films having a low light decay can be obtained by injecting Cl-radicals into plasmas.

Further, by changing a temperature of substrates 107, the above process was conducted to deposit micro crystalline silicon films with and without injection of Cl-radicals. Under no radical injection, a temperature above which a volume ratio of micro crystalline silicon within silicon films becomes not less than 0.8 was found to be 350° C. When the Cl-radicals were injected, a critical temperature was 250° C. From these experiments, it has been found that the micro crystalline silicon thin films can be obtained at a lower temperature.

Figure 9:
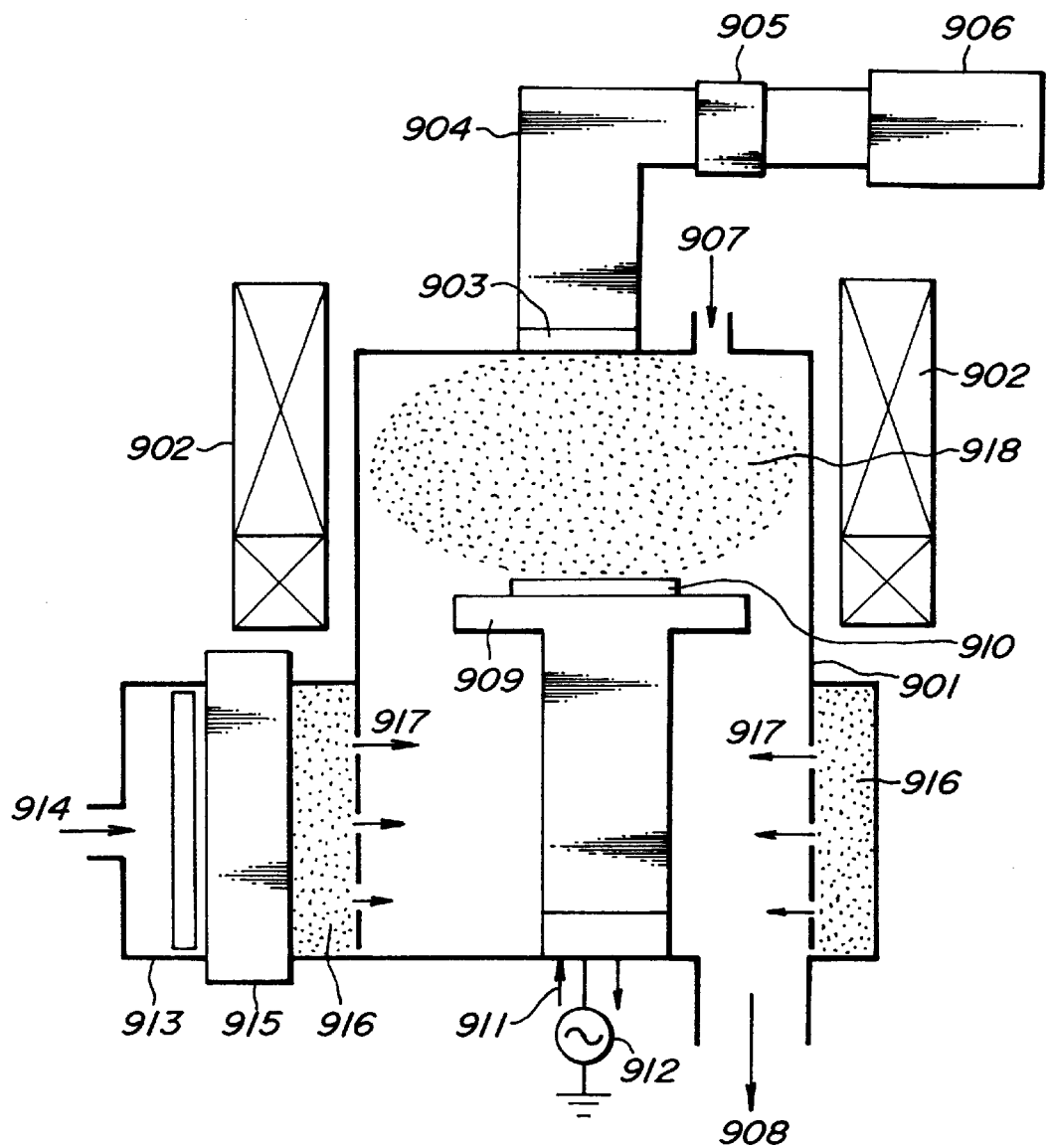
FIG. 9 is a schematic view depicting an embodiment of the precision processing apparatus according to the invention.

FIG. 9 is a schematic view depicting an embodiment of the plasma surface processing apparatus according to the invention. In the present embodiment, the apparatus is constructed as the plasma etching apparatus.

In FIG. 9, a reference numeral 901 denotes a vacuum chamber, 902 a magnetic coil, 903, a quartz window, 904 a wave guide, 905 an impedance matching device, 906 a microwave generator, 907 a first gas inlet, 908 an exhaust outlet, 909 an electrode serving as a substrate holder, 910 a substrate to be processed, 911 a cooling water jacket, 912 a high frequency power source, 913 a radical injection device, 914 a second gas inlet, 915 a radical generating device, 916 radicals, 917 slits and 918 denotes a plasma (ion).

The inventors prepared silicon substrates having silicon oxide films thereon and also having organic resist patterns formed on the silicon oxide films, and the plasma etching was carried out for the silicon oxide films by using the apparatus shown in FIG. 9.

A mixture gas of $CHF_3$ and $H_2$ was introduced via the first gas inlet 907 and a microwave was applied to the mixture gas from the microwave generator 906 by means of the wave guide 904. Various parameters such as gas flow rate, pressure, microwave power, bias and a ratio of $CHF_3/H_2$ were suitably adjusted to control a density and a composition of radicals, a density of ions and energy values. In one experiment, an etching speed of 5000 Å/minute was obtained, while a selection ratio of the etching for the silicon oxide with respect to the etching form the silicon was 15 and an uniformity 3σ was 15%.

Next, a hexafluoropropylenoxide gas (HFPO) was introduced in to the radical generating device 915 via the second gas inlet 914 and a temperature of the radical generating device was increased to generate $CF_2$-radicals, and the thus generated $CF_2$-radicals 916 were injected into the vacuum chamber 901 via the slits 917. By suitably changing various parameters such as flow rate, pressure, microwave power, bias voltage and a ratio of $CHF_3/H_2$, an etching speed of 6000 Å/minute for the silicon oxide film could be attained. A selectivity for silicon oxide was 40 and a uniformity 3σ was 10%. In this manner, by introducing $CF_2$-radicals, the etching property could be improved to a great extent.

From a measurement of a density of radicals within the plasma by the laser spectroscopy method, it has been confirmed that a selectivity of etching could be improved by an interaction between the H-radicals and the introduced $CF_3$-radicals.

Moreover, the $CF_3$-radicals produced in the manner mentioned above were reacted with H-radicals to generate CF-radicals and the thus generated CF-radicals were injected into the plasma. Then, an etching speed of 5000 Å/minute for the silicon oxide film, a selectivity for silicon oxide of 40 and a uniformity 3σ of 10% were observed. Also in this case, it was possible to obtain a good etching property.

From the above experiments, it has been found that by selectively introducing radicals which contribute effectively to the etching, the etching property can be improved extremely.

Now concrete examples conducted by using the plasma etching apparatus shown in FIG. 9 will be explained.

After placing silicon substrates 910 having a silicon oxide film of 1.5 micron meters and an organic resist pattern (design rule being 0.3 micron meters) on the electrode 909, a mixture gas of $CHF_3$ and $H_2$ was introduced into the vacuum chamber 901 via the first gas inlet 907 at a flow rate of 100 SCCM to maintain a pressure inside the vacuum chamber to 0.4 Pa, while a mixing ratio of $CHF_3$ and $H_2$ was changed.

Next, a microwave having a frequency of 2.45 GHz and a power of 900 W was generated to produce the plasma 918 and a high frequency bias voltage having a frequency of 400 KHz was applied from the bias voltage source 912. The high frequency bias voltage had a 200 V DC. voltage superposed thereon.

Figure 10:
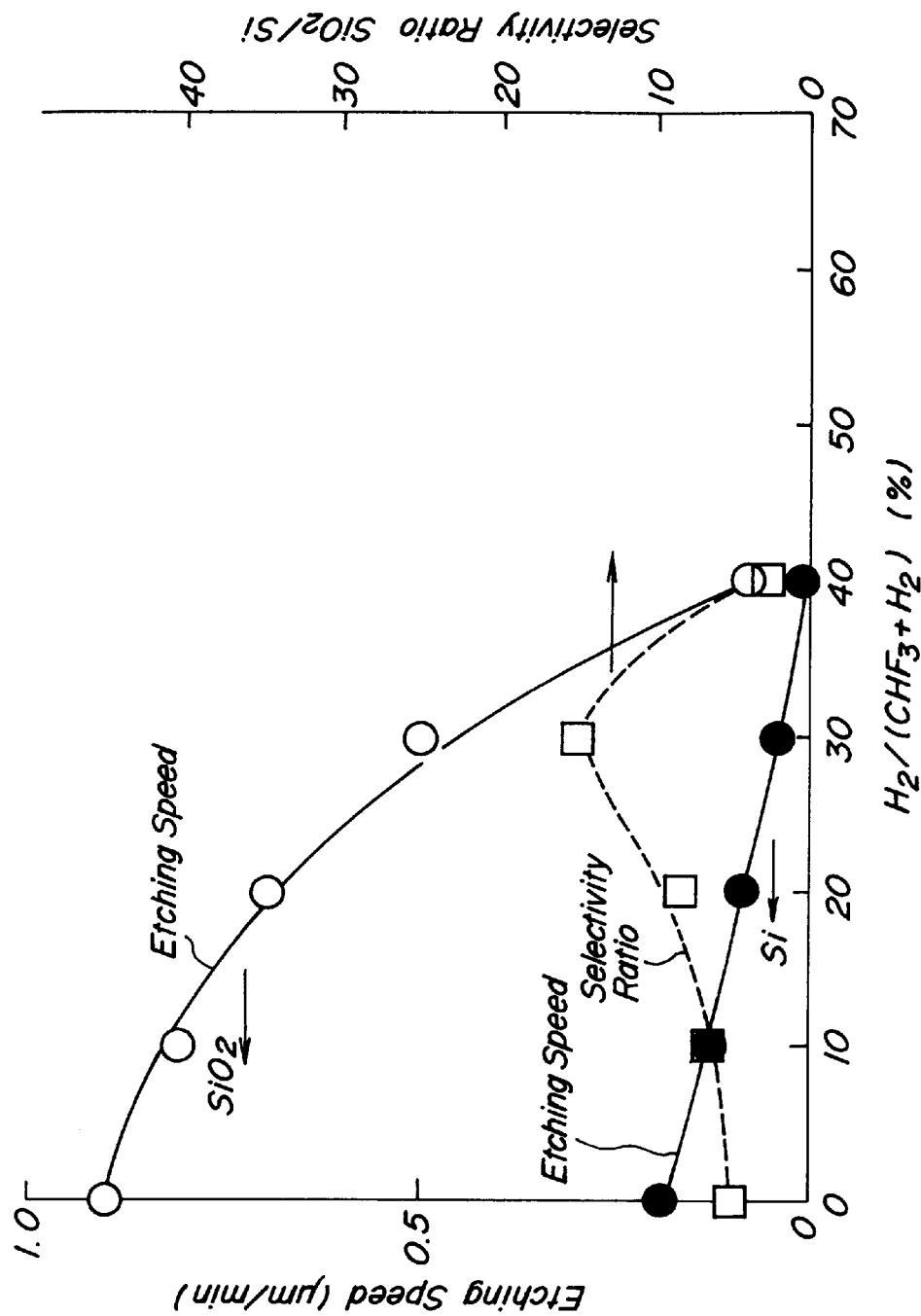
FIG. 10 is a graph showing a resulting of etching in which a hexafluoropropyleneoxide (HFPO) gas is not used.

FIG. 10 is a graph showing a relationship between an etching speed and a selectivity ratio with respect to a ratio of $H_2/(CHF_3+H_2)$. In FIG. 10, curves denoted by white circles and black circles represent an etching speed and a curve shown by white blocks expresses a selectivity ratio.

From FIG. 10, etching speeds for silicon and silicon oxide are decreased in accordance with an increase in a ratio of $H_2/(CHF_3+H_2)$. At a ratio of $H_2/(CHF_3+H_2)$ of 30%, an etching speed for silicon amounts to 5000 Å/minute and a selectivity ratio is about 15.

Then, a HFPO gas was introduced via the second gas inlet 914, the radical generating device 915 was heated to 500° C., and an inner pressure within the vacuum chamber 901 was maintained to 0.4 Pa. The mixture gas of $CHF_3$ and $H_2$ was introduced via the first gas inlet 907 at a flow rate of 100 SCCM, while a ratio of $H_2/(CHF_3+H_2)$ was changed. It should be noted that an inner pressure within the vacuum chamber 901 was maintained to 0.4 Pa during the process.

Further, a microwave of 900 W was applied to produce a plasma 918 and a high frequency bias voltage of 400 KHz was applied to a silicon substrate 910 having a silicon oxide film and an organic resist pattern formed thereon. A DC. voltage superimposed upon the high frequency bias voltage was changed from 100 V to 500 V.

Figure 11:
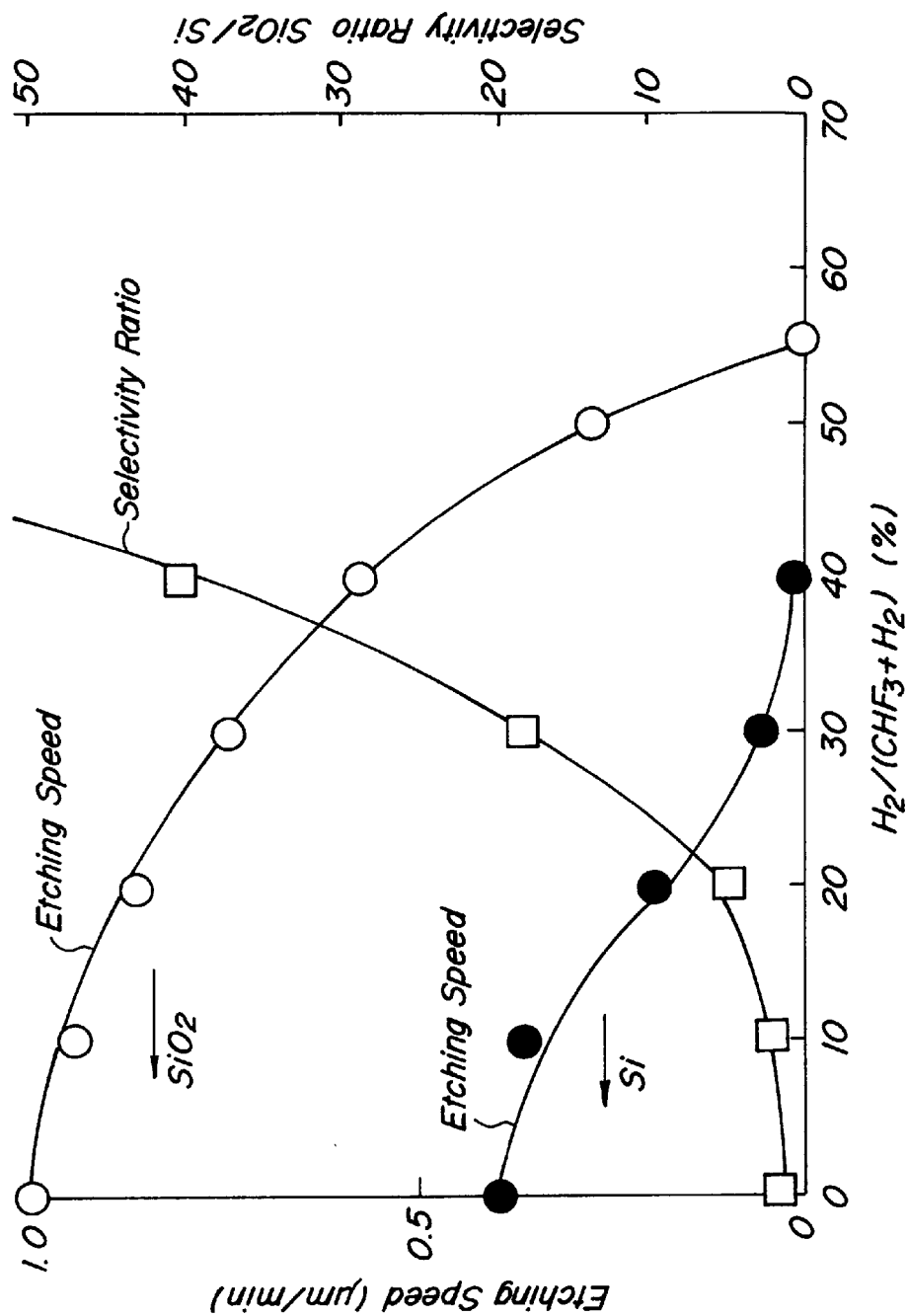
FIG. 11 is a graph representing a result of etching using a hexafluoropropyleneoxide (HFPO) gas.

FIG. 11 is a graph showing a result of the above experiments. In order to make easy a comparison with the test results shown in FIG. 10 (no introduction of HFPO gas), the same notation marks and scales were used.

From FIG. 11, at the high frequency bias voltage of 250 V, when a mixture ratio of $H_2$ was increased, etching speeds for the silicon oxide film and silicon substrate were reduced. However, at a mixture ratio of $H_2$ of 40%, an etching speed for the silicon oxide film was 6000 Å/minute, a selectivity ratio of the etching for the silicon oxide film to the etching for the silicon substrate was 40, and a uniformity, 3σ was 10%. A configuration of the etched silicon oxide film having a design rule of 0.2 μm and an aspect ratio of 5 was observed by SEM, it has been found that in the silicon oxide film there were formed recesses having substantially upright side walls. From this experiment, it is found that the injection of radicals into the plasma could improve an etching property to a great extent.

In order to make clear a reason of the above improvement in the etching property, a density within a plasma was measured by utilizing an infra-red semiconductor laser absorption spectroscopy.

At first, a density of radicals was measured under such a condition that the HFPO gas was not introduced, a microwave power was 900 W, a pressure was 0.4 Pa, a mixture gas of $CH_3$ and $H_2$ ($H_2/CHF_3+H_2$ being 30%) was used. A density of $CF_2$-radicals, a density of CF-radicals and a density of $CF_3$-radicals within a plasma were $10^{13}/cm^3$, $10^{12}/cm^3$ and $10^{11} cm^3$, respectively.

Then, only the HFPO gas was introduced to keep a pressure inside the vacuum chamber 901 at 0.4 Pa, and a temperature of the radical generating device 915 was increased to 500° C. A density of $CF_2$-radicals within the vacuum chamber 901 was $10^{14}/cm^3$. HFPO was dissociated by 100% within the vacuum chamber 901 and $CF_2$-radicals were generated.

Then, the $CF_2$-radicals generated by a thermal dissociation of HFPO were introduced into the vacuum chamber 901 and at the same time, a mixture gas of $CHF_3$ and $H_2$ ($H_2/CHF_3+H_2$ being 40%) was introduced into the vacuum chamber and the microwave discharge was generated. A density of $CF_2$-radicals and a density of CF-radicals were $10^{14}/cm^3$ and $10^{12}/cm^3$, respectively. A density of $CF_3$-radicals was $10^{11}/cm^3$. From this experiment, it has been confirmed that a density of $CF_2$-radicals can be increased to a great extent by introducing the $CF_2$-radicals. In this case, a density of $CF_2$-radicals can be controlled by adjusting a thermal dissociation temperature, and therefore a controlled amount of $CF_2$-radicals can be selectively introduced into the vacuum chamber 901.

A pattern configuration of the silicon oxide film was checked by SEM under such a condition that the $CF_2$-radicals were introduced and a selectivity ratio of the silicon substrate with respect to the silicon oxide film was set to 40.

In the silicon oxide film there were formed etched recesses having upright side walls, while the underlying silicon substrate was not etched at all.

In the above mentioned examples, the $CF_2$-radicals were generated by a thermal dissociation of HFPO, but according to the invention the $CF_2$-radicals may be produced by irradiating $C_3F_6$ with $CO_2$ laser having a wavelength of 9.6 $\mu$m and VUV radiation. In this case, a density of $CF_2$-radicals was $10^{16}/cm^3$.

In the above mentioned experiments, the $CF_2$-radical was generated by the thermal dissociation of HFPO, but according to the invention, CF-radicals may be produced by a reaction of H-radicals and laser dissociation, and the thus generated CF-radicals may be injected into a plasma of a mixture gas of $CHF_3$ and $H_2$ (a mixing ratio of $H_2$ to $CHF_3+H_2$ being 30%). Then, an etching speed for silicon oxide film was 5000 Å/minute was obtained, while a selectivity of etching for the silicon oxide film with respect to the silicon substrate was 50 and a uniformity, 3σ was 10%. Also, in this case, it is possible to attain an excellent etching property.

From the experiments so far explained, it is possible to effect a highly selective etching for the silicon oxide film with respect to the silicon substrate by generating the $CF_2$-radicals or CF-radicals by the thermal dissociation, radiation dissociation, dissociation by electron bombardment, discharge dissociation, plasma dissociation and bombardment by particles, and the thus generated radicals are injected into a plasma.

Now examples of the radical etching process by using the etching apparatus shown in FIG. 9 will be explained.

A reaction gas such as $C_4F_8$, $C_3F_8$, $CHF_3$ and CO is introduced via the first gas inlet 907 and discharge is generated by a microwave of 2.45 GHz such that electrons are subjected to a cyclotron movement within the discharge. At the same time, a magnetic field of about 875 Gausses is generated by the magnetic coil 902 to produce a plasma. It should be noted that the magnetic field is suitably selected together with a frequency for satisfying a cyclotron resonance of electrons. According to the invention, a high density plasma may be produced by introducing UHF (500 MHz), VHF (100 MHz) or RF (13.56 MHz), in this case the magnetic field may not be applied.

A substrate 910 such as a silicon wafer is placed on the electrode 909 provided within the vacuum chamber 901. The electrode 909 is coupled with a high frequency voltage source 912 via a matching device 905. A frequency of the high frequency voltage source 912 may be varied from about 100 KHz to about 100 MHz. Therefore, to the electrode 909 and thus the substrate 910 is applied a high frequency bias voltage of negative several volts to a negative 500 volts. The substrate 910 placed on the electrode 909 is cooled by a cooling water pipe 911. From the first gas inlet 907, a given amount of $CHF_3$ gas is introduced and the inside of the vacuum chamber 901 is kept at a desired gas pressure.

The $CHF_3$ gas introduced from the gas inlet 907 is dissociated in the plasma to produce radicals of F, CF, $CF_2$ and $CF_3$ and $CF^+$ ions. In FIG. 9, the plasma having such radicals and ions contained therein is denoted by 918. The thus generated radicals react with the substrate 910 and the substrate is subjected to the reactive ion etching. In this case, by controlling a density of radicals, a composition of radicals, a density of ions and energy by suitably adjusting flow rate, pressure, microwave power and bias voltage, it is possible to perform a desired etching.

Figure 12:
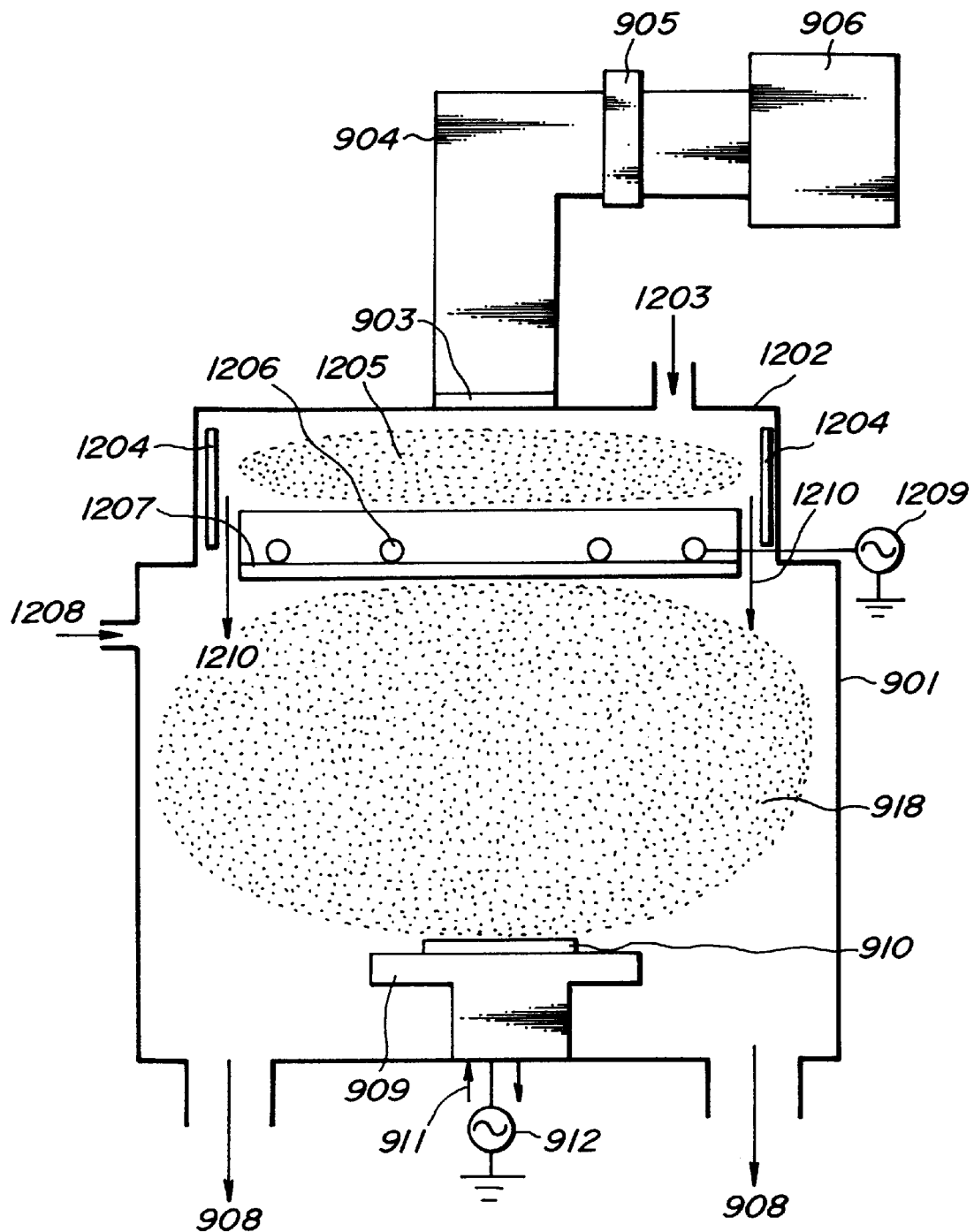
FIG. 12 is a schematic view depicting an embodiment of the apparatus for performing the precision process according to the invention.

FIG. 12 is a schematic view showing another embodiment of the plasma etching apparatus according to the invention.

In FIG. 12, portions similar to those shown in FIG. 9 are denoted by the same reference numerals used in FIG. 9 and their explanation is dispensed with. In the present embodiment, a reference numeral 1202 denotes a radical generating chamber, 1203 a first gas inlet, 1204 a permanent magnet, 1205 a plasma, 1206 a coil, 1207 a window, 1208 a second gas inlet, 1209 a high frequency voltage source, and a reference numeral 1210 represents radicals.

In the plasma etching apparatus shown in FIG. 12, a $Cl_2$ gas is introduced via the first gas inlet 1203 and a high frequency induction electric field is applied from the high frequency voltage source to produce a plasma 918 within the vacuum chamber 901. A silicon substrate 910 having a silicon oxide film formed on the substrate surface and a poly-silicon film formed on the silicon oxide film is placed on the electrode 909, but a high frequency bias voltage is not applied to the electrode. A density and a composition of radicals, a density of ions and energy are controlled by suitably adjusting flow rate, pressure and microwave power. Then, an etching speed is 4000 Å/minute, a selectivity of silicon with respect to silicon oxide is 13, and a uniformity 3σ is 20%. Such an etching property could not be satisfactory.

Then, a $Cl_2$ gas or a $Cl_2$ and $H_2$ or HCl gas is introduced via the first gas inlet 1203 and the microwave is applied to produce a plasma 1205, and the introduced gas is dissociated to produce Cl-radicals or H-radicals. The thus generate Cl-radicals or Cl-radicals and H-radicals or excited HCl are injected into the plasma 1210.

By suitably adjusting flow rate, pressure and microwave power, an etching speed for a poly-silicon film is 5000 Å/minute, a selectivity of etching for poly-silicon with respect to silicon is 33, and a uniformity 3σ is 10%. An etched pattern has upright side walls. In this manner, an etching property can be improved to a large extent.

By introducing $CF_2$-radicals or CF-radicals into the plasma, a highly selective etching for the silicon oxide can be realized. Also, by introducing Cl-radicals, a highly selective etching for the silicon oxide can be realized. Therefore, the etching method according to the invention can be advantageously utilized to manufacture a semiconductor device which requires a precious process.

Now several experiments for etching a silicon oxide will be explained.

As illustrated in FIG. 12, the radical generating chamber 1202 and the process chamber (vacuum chamber) 901 are provided. The radical generating chamber 1202 is constituted by a vacuum chamber in which radicals are generated. Within the radical generating chamber 1202, the permanent magnet 1204 is arranged such that the magnet surrounds an upper portion of the vacuum chamber 901. At the upper portion of the vacuum chamber 901 is mounted a wave guide 904 via the quartz window 903. The wave guide 904 is coupled with the microwave voltage source 906 by means of the impedance matching device 905. A microwave frequency is set of 2.45 GHz. Due to an interaction with the permanent magnet 1204, an ECR discharge is generated within the vacuum chamber 901. Into the radical generating chamber 1202, is supplied a reactive gas such as a $Cl_2$ gas via the first gas inlet 1203.

A starting material gas is introduced via the first gas inlet 1203 and discharge is generated by a microwave of 2.45 GHz such that electrons are subjected to a cyclotron movement within the discharge. At the same time, a magnetic field of about 875 Gausses is generated by the permanent magnet to produce a plasma having a high density. It should be noted that the magnetic field is suitably selected together with a microwave frequency for satisfying a cyclotron resonance of electrons. According to the invention, a high density plasma may be produced by introducing an electromagnetic wave such as UHF (500 MHz), VHF (100 MHz) or RF (13.56 MHz).

Within the vacuum chamber 901, the coil 1206 is arranged on the aluminum oxide window 1207 and one end of the coil is connected to a high frequency voltage source 1209 via an impedance matching device not shown. The other end of the coil 1206 is connected to the ground. When the high frequency voltage source 1209 applies a HF wave having a frequency of 13.56 MHz, there is produced a discharge of induction coupling type via the window 1207, and a plasma is generated within the vacuum chamber 901.

On the electrode 909 is placed the substrate 910 such a silicon wafer. The electrode 909 is connected to the high frequency bias voltage source 912 via the impedance matching device and a high frequency bias voltage of 600 KHz is applied to the electrode 909. Then, a bias voltage of negative several tens volts to negative 100 volts is applied to the electrode 909. The electrode 909 is further connected to cooling water tube 911.

The vacuum chamber 901 is connected to an exhausting pump via the exhaust outlets 908. Via the gas inlets 1203 and 1208, gases are introduced, so that a pressure inside the vacuum chamber 901 is kept to a desired value.

The substrate 910 placed on the electrode 909 includes a silicon wafer, a silicon oxide film having a thickness of 8 nm and formed on the silicon wafer by the thermal oxidation and a poly-silicon film formed on the silicon oxide film by CVD method and having a thickness of 150 nm. The poly-silicon film is doped with phosphorus to form an N-type poly-silicon region. On the poly-silicon film, there is further formed a resist pattern having a design rule of 0.3 $\mu$m and a thickness of 0.6 $\mu$m.

At first, a $Cl_2$ gas was introduced from the gas inlet 1203 at a flow rate of 100 SCCM. In this case, a gas pressure was set to 1 Pa. Then, a microwave power of 900 W was applied to produce the plasma 918 within the vacuum chamber 901.

Next, an RF high frequency power of 200–600 W was applied from the high frequency voltage source 1209 to the coil 1206 and the poly-silicon film on the substrate 910 was subjected to the selective etching. During this process, to the electrode 909 was applied a DC bias voltage of 30 V.

Figure 13:
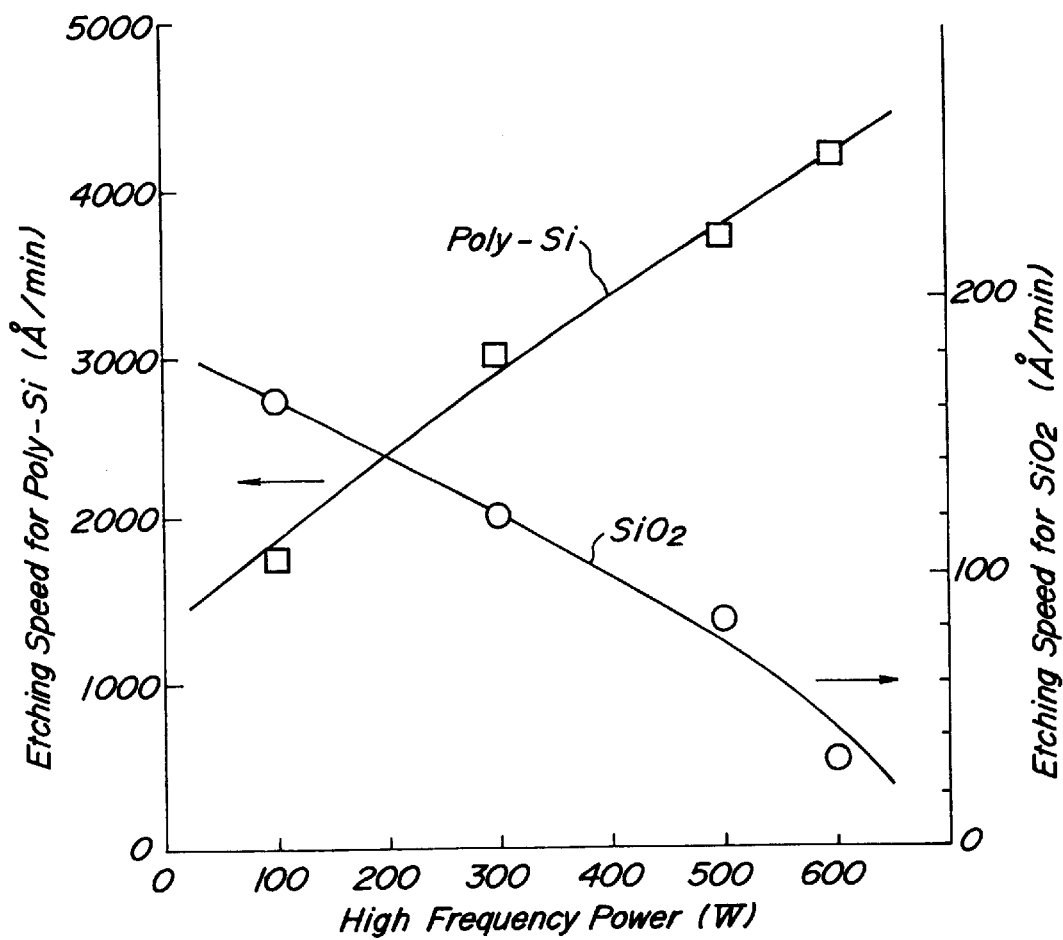
FIG. 13 is a graph expressing a dependency of etching speeds for poly-crystalline silicon and silicon oxide film upon an applied high frequency electric power when a microwave power is not applied.

FIG. 13 represents etching speed for poly-silicon and silicon oxide when no microwave power was applied, while the high frequency power was changed. When the high frequency power is increased, an etching speed for poly-silicon is increased, but an etching speed for silicon oxide is deceased. At 600 W high frequency power, a selectivity of etching for poly-silicon with respect to silicon oxide was about 14.

FIG. 14 shows etching speeds for poly-silicon and silicon oxide when the microwave power of 900 W was applied. Also in this case, an etching speed for poly-silicon is increased and an etching speed for silicon oxide is decreased in accordance with an increase of the high frequency power. In this case, an increase in the etching speed for poly-silicon is larger than that shown in FIG. 13. At the high frequency power of 600 W, the etching speed for poly-silicon was about 6500 Å/minute and the etching speed for silicon oxide was about 20 Å/minute. Therefore, the selectivity of etching for poly-silicon with respect to that for silicon oxide was about 33.

Etched configurations were observed by SEM when the microwave of 900 W was applied together with the high frequency power of 600 W under pressures of 0.5 Pa and 1 Pa and when the microwave was not applied. Under the pressure of 0.5 Pa, etched side walls were appeared to be upright.

The left hand drawing in FIG. 15 shows a configuration of the etched surface taken by SEM when the radicals were injected unto the plasma under the pressure of 1 Pa and the right hand drawing in FIG. 15 illustrates the etched configuration when radicals were not injected into the plasma. When the microwave was applied, a pattern having a size of 0.1 $\mu$m was formed upright, but under no radical injection, a side etching was observed.

In order to investigate the above mentioned phenomena, an ion density and a Cl atom density within the plasma were measured by using a probe and laser excitation fluorescent method. Then, it has been formed that the ion density and Cl atom density are increased largely when the microwave is introduced. That is to say, when the microwave is not introduced, non-dissociated $Cl_2$ is naturally reacted with the poly-silicon, and therefore high etching speed and upright etching could not be attained simultaneously. However, when the microwave is introduced, the $Cl_2$ gas is highly dissociated and Cl-radicals are injected into the etching plasma. Therefore, the poly-silicon is etched by Cl ions and Cl atoms, and a high selectivity, high etching speed and upright etching can be realized.

Now the control of a radical density and a radical composition according to the invention will be explained.

According to the invention, the radical generating device may be constructed in various manners. For instance, the radical generating device 114 of the first embodiment comprises the wave guide coupled with the microwave voltage source for introducing the microwave and the plasma 115 is produced within the radical generating tube 112. UHF wave or VHF wave or RF wave may be applied to produce the plasma within the plasma generating tube. In the second embodiment, the radical generating device 701 includes the laser or light emitting device such as $CO_2$ laser, excimer laser and mercury lamp. In the third embodiment, the radical generating device 915 comprises the heating device having a lamp or heater or a combination of the catalysis and heater or electron bombardment device or particle bombardment device. In the first embodiment, the gas introduced from the gas inlet 113 is dissociated to generate the radicals 116.

The generated radicals are transferred via the radical slits 117 into the plasma 109 formed within the vacuum chamber 101. It should be noted that the radical slits 117 may be detachably secured to the vacuum chamber 101. When plural kinds of radicals are generated, a desired kind of radicals may be selected by using radical slits made of a suitable material or by suitably setting a temperature.

By introducing the radicals supplied from the radical generating tube 112 into the plasma 109, it is possible to selectively increase a density of a particular kind of radicals within the plasma. Further by introducing radicals which are selectively reactive with special radicals generated in the plasma, a density of this special radicals in the plasma can be selectively reduced. In this manner, according to the invention, a density and a composition of radicals in the plasma can be precisely controlled over a very wide range.

In the embodiments so far explained, the radicals are generated by the discharge plasma due to microwave excitation, heating, light, and dissociation of gas due to catalysis, but according to the invention, another method such as the electron bombardment and particle bombardment may be used to generate radicals. Even in such methods, it is possible to control precisely a density and a composite of radicals within a plasma over a wide range. Moreover, in the above explained embodiments, the active substance is introduced into the radical generating chamber as the reactive gas, but according to the invention, the reactive substance may be introduced into the radical generating chamber as a liquid phase or a solid phase.

Further according to the invention, it is possible to provide a novel ad useful plasma CVD apparatus or plasma etching apparatus.

The thin film manufacturing apparatus according to the invention comprises a vacuum chamber including a plasma producing device, a vacuum exhausting means connected to the vacuum chamber, and a radical generating chamber including a radical generating device such as plasma generating device, light irradiation device, electron irradiation device, catalysis device and particle bombardment device for generating radicals having a controlled density and a controlled composition. In the radical generating chamber, an introduced gaseous, liquid phase or solid phase substance is dissociated to produce radicals having a controlled density and a controlled composition. The thus generated radicals are transferred into the vacuum chamber and are injected into a plasma produced by said plasma generating device.

When the method according to the invention is carried out by the known apparatus, it is enough to provide a simple radical generating device within the vacuum chamber. Then, it is possible to manufacture a thin film of a functional material having a high quality.

For instance, by the plasma CVD or reactive spattering according to the invention, it is possible to manufacture a silicon compound thin film such as amorphous silicon film, micro crystalline silicon film, single crystal silicon film, silicon oxide film, silicon nitride film, silicon carbide film and silicon-germanium film, a carbide compound thin film such as diamond film, hard carbon film and a carbon film such as flaren or germanium film or a gallium compound film or arsenic compound film or ITO film or Teflon film, a low dielectric constant film or high dielectric constant film or semiconductor film or insulating film or superconductor film or metal film. Further, by using a fluorocarbon gas, halogen gas such as $Cl_2$ gas or a hydrocarbon gas, the precise process can be performed.

Moreover, according to the invention, it is possible to provide various kinds of processing apparatuses such as plasma etching apparatus, plasma CVD apparatus, reactive sputtering apparatus, radical beam apparatus, radical CVD apparatus, radical etching apparatus and radical doping apparatus. According to the invention, such apparatuses can be constructed in a simple and cheap manner.

Furthermore, the generated radicals are transferred into the vacuum chamber and are injected into the plasma. Then a density of a desired kind of radicals such as $CF_2$-radicals can be selectively increased.

Moreover, by controlling a density and a composition of radicals by suitably selecting various parameters such as bias voltage, pressure and flow rate, it is possible to improve various etching properties such as the selectivity of etching for silicon with respect to that for silicon oxide, etching speed, etched configuration and uniformity.

What is claimed is:

1. A method of manufacturing a thin film of diamond by a plasma control process comprising the steps of:

introducing a substrate into a vacuum chamber;

forming a plasma of a first reactive gas introduced into said chamber and containing at least carbon;

introducing a second reactive gas consisting of a mixture gas containing at least hydrogen ($H_2$) and water ($H_2O$) with a ratio of the partial pressure of the water to the hydrogen of 0.5 into a radical generating chamber;

dissociating said second reactive gas with a plasma to produce H or OH radicals in such a manner that a density and a composition of said radicals are controlled; and introducing said H or OH radicals produced within said radical generating chamber into the plasma formed within said vacuum chamber such that a thin film of diamond is deposited on said substrate.

2. The method according to claim 1, wherein said first reactive gas is formed by a methyl alcohol ($CH_3OH$) or methane ($CH_4$).

3. The method according to claim 1, wherein a plasma is generated within said radical generating chamber and said second reactive gas is dissociated by said plasma generated within the radical generating chamber.

4. A method of manufacturing a thin film containing crystalline silicon by a plasma control process comprising the steps of:

introducing a substrate into a vacuum chamber;

forming a plasma of a first reactive gas introduced into said chamber and containing at least silicon;

introducing a second reactive gas comprising at least chloride (Cl) or hydrogen (H) into a radical generating chamber;

dissociating said second reactive gas to produce Cl or H radicals by catalysis or irradiation of light; and introducing said Cl or H radicals produced within said radical generating chamber into the plasma formed within said vacuum chamber such that a thin film containing crystalline silicon is deposited on said substrate.

5. The method according to claim 4, wherein said first reactive gas is formed by silane ($SiH_4$) or silane ($Si_2H_6$), and said second reactive gas is formed by hydrogen ($H_2$).

6. The method according to claim 5, wherein said second reactive gas is dissociated under a function of catalysis of a wall material of a radical producing mechanism provided within said radical generating chamber.

7. The method according to claim 4, wherein said first reactive gas is formed by silane ($SiH_4$) or disilane ($Si_2H_6$), and said second reactive gas is formed by chlorine ($Cl_2$).

8. The method according to claim 7, wherein said second reactive gas is dissociated by irradiation of light.

* * * * *

UNITED STATES PATENT AND TRADEMARK OFFICE
CERTIFICATE OF CORRECTION

PATENT NO. : 5,980,999
DATED : November 9, 1999
INVENTOR(S) : Goto et al.

It is certified that error appears in the above-identified patent and that said Letters Patent is hereby corrected as shown below:

Column 2,
Line 65, "frequency 30-30" should read -- frequency of 3-30 --;

Column 18,
Line 47, "silane" (second occurrence) should read -- disilane --.

Signed and Sealed this

Eighteenth Day of September, 2001

Attest:

Nicholas P. Godici

*Attesting Officer*

NICHOLAS P. GODICI
*Acting Director of the United States Patent and Trademark Office*